(12) United States Patent
Meyer et al.

(10) Patent No.: US 9,543,890 B2
(45) Date of Patent: Jan. 10, 2017

(54) ILLUMINATION AGNOSTIC SOLAR PANEL

(71) Applicant: TenKsolar, Inc., Bloomington, MN (US)

(72) Inventors: Dallas W. Meyer, Prior Lake, MN (US); Lowell J. Berg, Eden Prairie, MN (US); Forrest C. Meyer, Eden Prairie, MN (US); Raymond W. Knight, Chanhassen, MN (US); Steven E. Wheeler, Northfield, MN (US); John P. Novotny, Eden Prairie, MN (US)

(73) Assignee: TENKSOLAR, INC., Bloomington, MN (US)

(*) Notice: Subject to any disclaimer, the term of this patent is extended or adjusted under 35 U.S.C. 154(b) by 405 days.

(21) Appl. No.: 14/053,482

(22) Filed: Oct. 14, 2013

(65) Prior Publication Data
US 2014/0035373 A1    Feb. 6, 2014

Related U.S. Application Data

(60) Division of application No. 12/815,913, filed on Jun. 15, 2010, now Pat. No. 8,563,847, which is a
(Continued)

(51) Int. Cl.
H02S 40/38    (2014.01)
H02S 40/32    (2014.01)
(Continued)

(52) U.S. Cl.
CPC ............... *H02S 40/38* (2014.12); *G05F 1/46* (2013.01); *H02J 3/385* (2013.01); *H02J 7/35* (2013.01);
(Continued)

(58) Field of Classification Search
CPC .......... H02S 50/10; H02S 40/32; H02S 40/38; H02J 7/35; H02J 3/385; G05F 1/46
(Continued)

(56) References Cited

U.S. PATENT DOCUMENTS 3,094,439 A    6/1963    Mann et al.
3,350,234 A    10/1967    Ule
(Continued)

FOREIGN PATENT DOCUMENTS

CN    1388636 A    1/2003
CN    1628390      6/2005
(Continued)

OTHER PUBLICATIONS

CN Office Action dated Jan. 6, 2014 as received in Application No. 201080036349.0 (English Translation).
(Continued)

*Primary Examiner* — Allison Bourke
(74) *Attorney, Agent, or Firm* — Maschoff Brennan

(57) ABSTRACT

In one example, a photovoltaic module includes a plurality of discrete photovoltaic cells arranged in a plurality of cell rows, and a substantially electrically conductive and continuous area backsheet. The photovoltaic cells in each cell row are electrically connected in parallel to each other. The cell rows are electrically connected in series to each other and include a first row and a last row. The backsheet forms a current return path between the first and last rows. The photovoltaic cells are configured such that, in operation, current flows substantially uni-directionally through the plurality of photovoltaic cells between the first row and the last row.

16 Claims, 15 Drawing Sheets

Related U.S. Application Data continuation-in-part of application No. 12/357,260, filed on Jan. 21, 2009, now Pat. No. 8,933,320.

(60) Provisional application No. 61/187,202, filed on Jun. 15, 2009, provisional application No. 61/220,035, filed on Jun. 24, 2009, provisional application No. 61/248,136, filed on Oct. 2, 2009, provisional application No. 61/249,778, filed on Oct. 8, 2009, provisional application No. 61/249,783, filed on Oct. 8, 2009, provisional application No. 61/345,446, filed on May 17, 2010.

(51) Int. Cl.
*H02J 7/35* (2006.01)
*G05F 1/46* (2006.01)
*H02J 3/38* (2006.01)
*H01L 31/02* (2006.01)
*H01L 31/048* (2014.01)
*H02M 7/00* (2006.01)
*H02S 40/34* (2014.01)
*H01L 31/05* (2014.01)
*H02S 30/10* (2014.01)

(52) U.S. Cl.
CPC ......... *H02S 40/32* (2014.12); *H01L 31/02008* (2013.01); *H01L 31/02021* (2013.01); *H01L 31/048* (2013.01); *H01L 31/0504* (2013.01); *H02M 7/003* (2013.01); *H02S 30/10* (2014.12); *H02S 40/34* (2014.12); *Y02E 10/58* (2013.01); *Y10T 307/549* (2015.04)

(58) Field of Classification Search
USPC .................. 320/101–103; 136/243–265, 293
See application file for complete search history.

(56) References Cited

U.S. PATENT DOCUMENTS

| | | |
|---|---|---|
| 3,419,434 A | 12/1968 | Colehower |
| 3,833,426 A | 9/1974 | Mesch |
| 4,002,160 A | 1/1977 | Mather |
| 4,020,827 A | 5/1977 | Broberg |
| 4,033,327 A | 7/1977 | Pei |
| 4,120,282 A | 10/1978 | Espy |
| 4,154,998 A | 5/1979 | Luft et al. |
| 4,158,768 A | 6/1979 | Lavelli |
| 4,212,293 A | 7/1980 | Nugent |
| 4,227,298 A | 10/1980 | Keeling |
| 4,309,334 A | 1/1982 | Valitsky |
| 4,316,448 A | 2/1982 | Dodge |
| 4,321,416 A | 3/1982 | Tennant |
| 4,369,498 A | 1/1983 | Schulte |
| 4,410,757 A | 10/1983 | Stamminger et al. |
| 4,453,119 A * | 6/1984 | Staler ............... H02J 7/008 136/293 |
| 4,461,922 A | 7/1984 | Gay et al. |
| 4,481,378 A | 11/1984 | Lesk |
| 4,514,579 A | 4/1985 | Hanak |
| 4,604,494 A | 8/1986 | Shepard, Jr. |
| 4,611,090 A | 9/1986 | Catella |
| 4,617,421 A | 10/1986 | Nath |
| 4,695,788 A | 9/1987 | Marshall |
| 4,716,258 A | 12/1987 | Murtha |
| 4,742,291 A * | 5/1988 | Bobier ............... H02J 7/35 136/293 |
| 4,747,699 A | 5/1988 | Kobayashi et al. |
| 4,755,921 A | 7/1988 | Nelson |
| 4,773,944 A | 9/1988 | Nath |
| 4,854,974 A | 8/1989 | Carlson |
| 4,933,022 A | 6/1990 | Swanson |
| 4,964,713 A | 10/1990 | Goetzberger |
| 4,966,631 A | 10/1990 | Matlin |
| 5,013,141 A | 5/1991 | Sakata |
| 5,021,099 A | 6/1991 | Kim |
| 5,048,194 A | 9/1991 | McMurtry |
| 5,096,505 A | 3/1992 | Fraas et al. |
| 5,205,739 A | 4/1993 | Malo |
| 5,246,782 A | 9/1993 | Kennedy |
| 5,268,037 A | 12/1993 | Glatfelter |
| 5,270,636 A | 12/1993 | Lafferty |
| 5,288,337 A | 2/1994 | Mitchell |
| 5,344,497 A | 9/1994 | Fraas |
| 5,374,317 A | 12/1994 | Lamb |
| 5,457,057 A | 10/1995 | Nath |
| 5,468,988 A | 11/1995 | Glatfelter |
| 5,478,402 A | 12/1995 | Hanoka |
| 5,491,040 A | 2/1996 | Chaloner-Gill |
| 5,493,096 A | 2/1996 | Koh |
| 5,505,789 A | 4/1996 | Fraas |
| 5,513,075 A | 4/1996 | Capper |
| 5,538,563 A | 7/1996 | Finkl |
| 5,571,338 A | 11/1996 | Kadonome |
| 5,593,901 A | 1/1997 | Oswald |
| 5,719,758 A | 2/1998 | Nakata |
| 5,735,966 A | 4/1998 | Luch |
| 5,745,355 A | 4/1998 | Tracey et al. |
| 5,801,519 A | 9/1998 | Midya |
| 5,896,281 A | 4/1999 | Bingley |
| 5,910,738 A | 6/1999 | Shinohe |
| 5,982,157 A | 11/1999 | Wattenhoffer |
| 5,990,413 A | 11/1999 | Ortabasi |
| 5,994,641 A | 11/1999 | Kardauskas |
| 6,011,215 A | 1/2000 | Glatfeller |
| 6,017,002 A | 1/2000 | Burke et al. |
| 6,043,425 A | 3/2000 | Assad |
| 6,077,722 A | 6/2000 | Jansen |
| 6,111,189 A | 8/2000 | Garvison |
| 6,111,454 A | 8/2000 | Shinohe |
| 6,111,767 A | 8/2000 | Handleman |
| 6,134,784 A | 10/2000 | Carrie |
| 6,177,627 B1 | 1/2001 | Murphy |
| 6,188,012 B1 | 2/2001 | Ralph |
| 6,201,180 B1 | 3/2001 | Meyer |
| 6,281,485 B1 | 8/2001 | Siri |
| 6,288,325 B1 | 9/2001 | Jansen |
| 6,294,723 B2 | 9/2001 | Uematsu |
| 6,331,208 B1 | 12/2001 | Nishida |
| 6,337,436 B1 | 1/2002 | Ganz |
| 6,339,538 B1 | 1/2002 | Handleman |
| 6,351,130 B1 * | 2/2002 | Preiser ............... G01R 31/40 320/101 |
| 6,462,265 B1 | 10/2002 | Sasaoka et al. |
| 6,465,724 B1 | 10/2002 | Garvison |
| 6,479,744 B1 | 11/2002 | Tsuzuki et al. |
| 6,515,215 B1 | 2/2003 | Mimura |
| 6,528,716 B2 | 3/2003 | Collette |
| 6,706,963 B2 | 3/2004 | Gaudiana |
| 6,739,692 B2 | 5/2004 | Unosawa |
| 6,750,391 B2 | 6/2004 | Bower |
| 6,753,692 B2 | 6/2004 | Toyomura |
| 6,803,513 B2 | 10/2004 | Beernink |
| 6,858,461 B2 | 2/2005 | Oswald |
| 6,870,087 B1 | 3/2005 | Gallagher |
| 6,882,063 B2 | 4/2005 | Droppo |
| 6,903,261 B2 | 6/2005 | Habraken |
| 6,966,184 B2 | 11/2005 | Toyomura |
| 6,992,256 B1 | 1/2006 | Wiley |
| 7,009,412 B2 | 3/2006 | Chong |
| 7,094,441 B2 | 8/2006 | Chittibabu |
| 7,099,169 B2 | 8/2006 | West et al. |
| 7,138,730 B2 | 11/2006 | Lai |
| 7,205,626 B1 | 4/2007 | Nakata |
| 7,259,322 B2 | 8/2007 | Gronet |
| 7,276,724 B2 | 10/2007 | Sheats |
| 7,297,865 B2 | 11/2007 | Terao |
| 7,301,095 B2 | 11/2007 | Murphy |
| 7,336,004 B2 | 2/2008 | Lai |
| 7,339,108 B2 | 3/2008 | Tur |
| 7,342,171 B2 | 3/2008 | Khouri |
| 7,388,146 B2 | 6/2008 | Fraas |

(56) References Cited

U.S. PATENT DOCUMENTS

| | | |
|---|---|---|
| 7,432,438 B2 | 10/2008 | Rubin et al. |
| 7,498,508 B2 | 3/2009 | Rubin et al. |
| 7,997,938 B2 | 8/2011 | Costello et al. |
| 8,013,239 B2 | 9/2011 | Rubin et al. |
| 8,138,631 B2 | 3/2012 | Allen et al. |
| 8,212,139 B2 | 7/2012 | Meyer |
| 8,563,847 B2 | 10/2013 | Meyer |
| 8,748,727 B2 | 6/2014 | Meyer |
| 8,828,778 B2 | 9/2014 | Meyer |
| 8,829,330 B2 | 9/2014 | Meyer |
| 8,933,320 B2 | 1/2015 | Meyer |
| 2001/0008144 A1 | 7/2001 | Uematsu |
| 2002/0179140 A1 | 12/2002 | Toyomura |
| 2003/0047208 A1 | 3/2003 | Glenn et al. |
| 2003/0121228 A1 | 7/2003 | Stoehr |
| 2003/0121542 A1 | 7/2003 | Harneit et al. |
| 2003/0201007 A1 | 10/2003 | Fraas |
| 2004/0016454 A1 | 1/2004 | Murphy et al. |
| 2004/0055594 A1 | 3/2004 | Hochberg |
| 2004/0089337 A1 | 5/2004 | Chou |
| 2004/0261834 A1 | 12/2004 | Basore |
| 2004/0261955 A1 | 12/2004 | Shingleton et al. |
| 2005/0000562 A1 | 1/2005 | Kataoka et al. |
| 2005/0022857 A1 | 2/2005 | Daroczi |
| 2005/0034751 A1 | 2/2005 | Gross |
| 2005/0061360 A1 | 3/2005 | Horioka et al. |
| 2005/0081909 A1 | 4/2005 | Paull |
| 2005/0115176 A1 | 6/2005 | Russell |
| 2005/0121067 A1 | 6/2005 | Toyomura et al. |
| 2005/0133081 A1 | 6/2005 | Amato |
| 2005/0158891 A1 | 7/2005 | Barth et al. |
| 2005/0172995 A1 | 8/2005 | Rohrig |
| 2005/0194939 A1 | 9/2005 | Duff, Jr. |
| 2005/0263179 A1 | 12/2005 | Gaudiana |
| 2005/0268959 A1 | 12/2005 | Aschenbrenner |
| 2005/0278076 A1 | 12/2005 | Barbir |
| 2006/0001406 A1 | 1/2006 | Matan |
| 2006/0042681 A1 | 3/2006 | Korman |
| 2006/0054212 A1 | 3/2006 | Fraas |
| 2006/0086384 A1 | 4/2006 | Nakata |
| 2006/0092588 A1 | 5/2006 | Realmuto et al. |
| 2006/0162772 A1 | 7/2006 | Presher, Jr. |
| 2006/0174931 A1 | 8/2006 | Mapes et al. |
| 2006/0174939 A1 | 8/2006 | Matan |
| 2006/0180197 A1 | 8/2006 | Gui |
| 2006/0185716 A1 | 8/2006 | Murozono |
| 2006/0185727 A1 | 8/2006 | Matan |
| 2006/0213548 A1 | 9/2006 | Bachrach |
| 2006/0225777 A1 | 10/2006 | Buechel |
| 2006/0235717 A1 | 10/2006 | Sharma |
| 2006/0261830 A1 | 11/2006 | Taylor |
| 2006/0266407 A1 | 11/2006 | Lichey |
| 2007/0035864 A1 | 2/2007 | Vasylyev |
| 2007/0056626 A1 | 3/2007 | Funcell |
| 2007/0068567 A1 | 3/2007 | Rubin et al. |
| 2007/0079861 A1 | 4/2007 | Morali |
| 2007/0095384 A1 | 5/2007 | Farquhar |
| 2007/0103108 A1 | 5/2007 | Capp |
| 2007/0113885 A1 | 5/2007 | Chan |
| 2007/0124619 A1 | 5/2007 | Mizukami |
| 2007/0125415 A1 | 6/2007 | Sachs |
| 2007/0144577 A1 | 6/2007 | Rubin et al. |
| 2007/0151594 A1 | 7/2007 | Mascolo et al. |
| 2007/0157964 A1 | 7/2007 | Gronet |
| 2007/0179720 A1 | 8/2007 | Becker et al. |
| 2007/0186971 A1 | 8/2007 | Lochun |
| 2007/0193620 A1 | 8/2007 | Hines |
| 2007/0199588 A1 | 8/2007 | Rubin et al. |
| 2007/0215195 A1 | 9/2007 | Buller |
| 2007/0235077 A1 | 10/2007 | Nagata |
| 2007/0240755 A1 | 10/2007 | Lichy |
| 2007/0251569 A1 | 11/2007 | Shan |
| 2007/0261731 A1 | 11/2007 | Abe |
| 2007/0266672 A1 | 11/2007 | Bateman |
| 2007/0272295 A1 | 11/2007 | Rubin et al. |
| 2007/0273338 A1 | 11/2007 | West |
| 2007/0295381 A1 | 12/2007 | Fujii |
| 2008/0000516 A1 | 1/2008 | Shifman |
| 2008/0029149 A1 | 2/2008 | Simon |
| 2008/0029152 A1 | 2/2008 | Milshtein |
| 2008/0037141 A1 | 2/2008 | Tom |
| 2008/0047003 A1 | 2/2008 | Wong et al. |
| 2008/0092944 A1 | 4/2008 | Rubin et al. |
| 2008/0122518 A1 | 5/2008 | Besser et al. |
| 2008/0142071 A1 | 6/2008 | Dorn et al. |
| 2008/0163922 A1 | 7/2008 | Horne et al. |
| 2008/0164766 A1 | 7/2008 | Adest et al. |
| 2008/0210286 A1 | 9/2008 | Ball |
| 2008/0236648 A1 | 10/2008 | Klein et al. |
| 2008/0290368 A1 | 11/2008 | Rubin |
| 2008/0298051 A1 | 12/2008 | Chu |
| 2009/0025778 A1 | 1/2009 | Rubin et al. |
| 2009/0121968 A1 | 5/2009 | Okamoto |
| 2009/0151775 A1 | 6/2009 | Pietrzak |
| 2009/0183760 A1 | 7/2009 | Meyer |
| 2009/0183763 A1 | 7/2009 | Meyer |
| 2009/0183764 A1 | 7/2009 | Meyer |
| 2009/0217965 A1 | 9/2009 | Dougal et al. |
| 2009/0242021 A1 | 10/2009 | Petkie et al. |
| 2009/0250093 A1 | 10/2009 | Chen |
| 2009/0302681 A1* | 12/2009 | Yamada ................ H02J 7/35 307/46 |
| 2010/0000165 A1 | 1/2010 | Koller |
| 2010/0014738 A1 | 1/2010 | Birnholz et al. |
| 2010/0089390 A1 | 4/2010 | Miros et al. |
| 2010/0131108 A1 | 5/2010 | Meyer |
| 2010/0175337 A1 | 7/2010 | Mascolo et al. |
| 2010/0212720 A1 | 8/2010 | Meyer et al. |
| 2010/0219688 A1 | 9/2010 | Shyu et al. |
| 2010/0253151 A1 | 10/2010 | Gerhardinger et al. |
| 2010/0282293 A1 | 11/2010 | Meyer et al. |
| 2010/0313499 A1 | 12/2010 | Gangemi |
| 2010/0313933 A1 | 12/2010 | Xu |
| 2011/0018353 A1 | 1/2011 | Yu |
| 2011/0039992 A1 | 2/2011 | Irie |
| 2011/0067748 A1 | 3/2011 | Pfeiffer |
| 2011/0241431 A1 | 10/2011 | Chen et al. |
| 2011/0301772 A1 | 12/2011 | Zuercher et al. |
| 2012/0042588 A1 | 2/2012 | Erickson, Jr. |
| 2012/0204935 A1 | 8/2012 | Meyer et al. |
| 2012/0234374 A1 | 9/2012 | Meyer |
| 2012/0319494 A1 | 12/2012 | Ecrabey et al. |
| 2013/0062956 A1 | 3/2013 | Myer |
| 2013/0312812 A1 | 11/2013 | Meyer |
| 2014/0174535 A1 | 6/2014 | Meyer |
| 2014/0360561 A1 | 12/2014 | Meyer |
| 2015/0047689 A1 | 2/2015 | Meyer |

FOREIGN PATENT DOCUMENTS

| | | |
|---|---|---|
| CN | 101336476 | 12/2008 |
| DE | 3708548 | 9/1988 |
| DE | 4027325 | 4/1992 |
| DE | 20314372 | 12/2003 |
| DE | 102004001248 | 1/2005 |
| DE | 202006020180 | 12/2007 |
| EP | 1724842 | 11/2006 |
| EP | 1744372 | 1/2007 |
| EP | 2172980 | 4/2010 |
| EP | 2251941 | 11/2010 |
| GB | 2331530 | 5/1999 |
| JP | 60-141152 | 9/1985 |
| JP | 02-025079 | 1/1990 |
| JP | 09-045946 | 2/1997 |
| JP | 11-041832 | 2/1997 |
| JP | 10-69321 | 3/1998 |
| JP | 10-245935 | 9/1998 |
| JP | 10-281562 | 10/1998 |
| JP | 11-103538 | 4/1999 |
| JP | 2000-114571 | 4/2000 |
| JP | 2000-213255 | 8/2000 |
| JP | 2000-357812 | 12/2000 |
| JP | 2002-073184 | 3/2002 |
| JP | 2002-268891 | 10/2002 |

(56) References Cited

FOREIGN PATENT DOCUMENTS

| | | |
|---|---|---|
| JP | 2002-305318 | 10/2002 |
| JP | 2002-314112 | 10/2002 |
| JP | 2003-026455 | 1/2003 |
| JP | 2003-282918 | 10/2003 |
| JP | 2006-040931 | 2/2006 |
| JP | 2006-040931 A | 2/2006 |
| JP | 2006-302147 | 11/2006 |
| JP | 2007-234795 | 9/2007 |
| JP | 2007-294630 | 11/2007 |
| JP | 2009-032945 | 2/2009 |
| JP | 2009-545877 | 12/2009 |
| JP | 2011-2991 | 1/2011 |
| JP | 2011-129626 | 6/2011 |
| JP | 2009-503870 | 9/2011 |
| KR | 10-1998-087002 | 12/1998 |
| KR | 10-20020070104300 | 10/2007 |
| KR | 10-2007-0107318 | 11/2007 |
| KR | 10-2010-0129721 | 12/2010 |
| TW | 201042770 | 12/2010 |
| TW | 201106490 | 12/2011 |
| WO | 02/35613 | 2/2002 |
| WO | 2004/021455 | 3/2004 |
| WO | 2007/071064 | 6/2007 |
| WO | 2007-095757 | 8/2007 |
| WO | 2007/137407 | 12/2007 |
| WO | 2008/042828 | 1/2008 |
| WO | 2008/016453 | 2/2008 |
| WO | 2008/028677 | 3/2008 |
| WO | 2008-046201 | 11/2008 |
| WO | 2008/141415 | 11/2008 |
| WO | 2009/012567 | 1/2009 |
| WO | 2009/076740 | 6/2009 |
| WO | 2009/009211 | 7/2009 |
| WO | 2009/092110 | 7/2009 |
| WO | 2009/092111 | 7/2009 |
| WO | 2010/012062 | 2/2010 |
| WO | 2010/037393 | 4/2010 |
| WO | 2010/068226 | 6/2010 |
| WO | 2010/096833 | 8/2010 |
| WO | 2010/148009 | 12/2010 |
| WO | 2011/011855 | 2/2011 |
| WO | 2011/109741 | 9/2011 |

OTHER PUBLICATIONS

JP Office Action dated Dec. 17, 2013 as received in Application No. 2012-516209 (English Translation).
JP Office Action dated Jun. 24, 2014 as received in Application No. 2012-516209 (English Translation).
CN Office Action dated Jun. 6, 2014 as received in Application No. 201080036349.0 (English Translation).
Chinese Office Action in Chinese Application No. 200980109824.X, dated Aug. 24, 2011, 10 pgs.
Chinese Office Action in Chinese Application No. 201080017252.5, dated Aug. 13, 2013, 19 pgs.
Chinese Office Action in Chinese Application No. 201080017252.5, dated Apr. 28, 2014, 12 pgs.
Chinese Office Action in Chinese Application No. 201080017252.5, dated Nov. 14, 2014, 10 pgs.
European Search Report in European Application No. 10744485.3, dated Jan. 17, 2014, 4 pgs.
European Office Action in European Application No. 10790069.8, dated Sep. 9, 2014, 5 pgs.
European Search Report in European Application No. 12846494.8, dated Dec. 18, 2014, 7 pgs.
Japanese Office Action in Japanese Application No. 2012-516209, dated Oct. 28, 2014, 8 pgs.
International Search Report and Written Opinion, as issued in connection with International Patent Application No. PCT/US2009/031594, mailed Jun. 25, 2009, 7 pgs.
International Search Report and Written Opinion, as issued in connection with International Patent Application No. PCT/US2009/031596, mailed Sep. 8, 2009, 8 pgs.
International Search Report and Written Opinion, as issued in connection with International Patent Application No. PCT/US2010/038702, mailed Jan. 5, 2011, 7 pgs.
International Search Report and Written Opinion, as issued in connection with International Patent Application No. PCT/US2012/062784, mailed Mar. 19, 2013, 13 pgs.
International Search Report and Written Opinion, as issued in connection with International Patent Application No. PCT/US2013/062747, mailed Jan. 28, 2014, 14 pgs.
International Search Report and Written Opinion, as issued in connection with International Patent Application No. PCT/US2014/052166, mailed Nov. 26, 2014, 12 pgs.
US Restriction Requirement in U.S. Appl. No. 12/357,268, dated Nov. 29, 2011, 9 pgs.
US Restriction Requirement in U.S. Appl. No. 12/357,268, dated Feb. 3, 2012, 7 pgs.
US Office Action in U.S. Appl. No. 12/357,268, dated Aug. 2, 2012, 27 pgs.
US Office Action in U.S. Appl. No. 12/357,268, dated Nov. 21, 2012, 22 pgs.
US Notice of Allowance in U.S. Appl. No. 12/357,268, dated Mar. 11, 2014, 12 pgs.
US Restriction Requirement in U.S. Appl. No. 12/684,595, dated Jan. 9, 2012, 11 pgs.
US Notice of Allowance in U.S. Appl. No. 12/684,595, dated Mar. 16, 2012, 12 pgs.
US Restriction Requirement in U.S. Appl. No. 13/485,210, dated Jan. 15, 2014, 5 pgs.
US Notice of Allowance in U.S. Appl. No. 13/485,210, dated May 29, 2014, 13 pgs.
US Restriction Requirement in U.S. Appl. No. 12/357,260, dated Aug. 2, 2012, 5 pgs.
US Office Action in U.S. Appl. No. 12/357,260, dated Feb. 5, 2013, 17 pgs.
US Office Action in U.S. Appl. No. 12/357,260, dated May 23, 2013, 23 pgs.
US Office Action in U.S. Appl. No. 12/357,260, dated Apr. 22, 2014, 26 pgs.
US Notice of Allowance in U.S. Appl. No. 12/357,260, dated Sep. 4, 2014, 8 pgs.
US Restriction Requirement in U.S. Appl. No. 12/357,277, dated Nov. 10, 2011, 7 pgs.
US Office Action in U.S. Appl. No. 12/357,277, dated Jan. 26, 2012, 11 pgs.
US Office Action in U.S. Appl. No. 12/357,277, dated Jul. 19, 2012, 12 pgs.
US Restriction Requirement in U.S. Appl. No. 12/711,040, dated Jun. 18, 2012, 7 pgs.
US Office Action in U.S. Appl. No. 12/711,040, dated Nov. 26, 2012, 29 pgs.
US Office Action in U.S. Appl. No. 12/711,040, dated Jul. 5, 2013, 35 pgs.
US Restriction Requirement in U.S. Appl. No. 12/815,913, dated May 29, 2012, 6 pgs.
US Office Action in U.S. Appl. No. 12/815,913, dated Oct. 5, 2012, 19 pgs.
US Notice of Allowance in U.S. Appl. No. 12/815,913, dated Sep. 3, 2013, 11 pgs.
US Restriction Requirement in U.S. Appl. No. 13/207,164, dated Sep. 28, 2012, 7 pgs.
US Office Action in U.S. Appl. No. 13/207,164, dated Feb. 14, 2013, 20 pgs.
US Office Action in U.S. Appl. No. 13/207,164, dated Aug. 29, 2013, 34 pgs.
US Notice of Allowance in U.S. Appl. No. 13/207,164, dated Nov. 27, 2013, 12 pgs.
Chinese Office Action in Chinese Application No. 201180048973.7, dated Jan. 30, 2015, 10 pgs.
Japanese Office Action in Japanese Application No. 2014-540038, dated Mar. 17, 2015, 11 pgs.
European Search Report dated May 28, 2015 as received in Application No. 15 15 8419.

(56) References Cited

OTHER PUBLICATIONS

Chen, et al., "Multiinput Converter With Power Factor Correction, Maximum Power Point Tracking, and Ripple-Free Input Currents", IEEE Transactions on Power Electronics, vol. 19, No. 3, May 1, 2004, pp. 631-639.
Sefa, et al., "Experimental Study of Interleaved MPPT Converter for PV Systems", 35th Annual Conference of IEEE Industrial Electronics, Nov. 3-5, 2009, pp. 456-461.
JP Office Action dated Oct. 20, 2015 as received in Application No. 2015-026500 (English Translation).
European Office Action in European Application No. 12846494.8, dated Oct. 16, 2015, 4 pgs.
Japanese Office Action in Japanese Application No. 2014-540038, dated Aug. 18, 2015, 19 pgs.
Japanese Office Action in Japanese Application No. 2015-026500, dated Oct. 20, 2015, 12 pgs.
US Office Action in U.S. Appl. No. 12/711,040, dated Sep. 25, 2015, 37 pgs.
US Office Action in U.S. Appl. No. 13/957,227, dated Sep. 11, 2015, 20 pgs.
International Search Report and Written Opinion, mailed Sep. 27, 2010, as issued on connection with International Patent Application No. PCT/US2010/025108.
International Search Report and Written Opinion, mailed Sep. 29, 2009, as issued in connection with International Patent Application No. PCT/US2009/031597.
International Search Report and Written Opinion, mailed Aug. 31, 2011, as issued in connection with International Patent Application No. PCT/US2010/061864.
International Preliminary Report mailed Dec. 29, 2011, as issued in connection with International Patent Application No. PCT/US2010/038702.
International Search Report and Written Opinion mailed Mar. 19, 2012, as issued in connections with International Patent Application No. PCT/US2011/047291.
Supplementary European Search Report dated Jun. 13, 2013, as received in European Application No. EP 09702762.
Japanese Office Action dated Feb. 19, 2013 in Japanese Application No. 2011-551303.
Zeghbroeck, Bart V., Ellipsometer Data Table, http://ece-www.colorado.edu/˜bart/book/ellipstb.htm, 1997.
Supplemental European Search Report dated May 2, 2013, as received in European Application No. 10790069.8.
Japanese Office Action dated Apr. 30, 2013 in Japanese Application No. 2012-516209.
Solatron Techonologies, Wiring Solar Modules and Batteries, <http://web.archive.org/web/2003206212224/http://partsonsale.com/learnwiring.htm>, web archived May 2008.
Chinese Office Action in Chinese Application No. 201080017252.5, dated May 26, 2015, 7 pgs.
Chinese Office Action in Chinese Application No. 201180048973.7, dated Aug. 12, 2015, 8 pgs.
European Office Action in European Application No. 15158419.0, dated Jun. 9, 2015, 7 pgs.
Korean Office Action in Korean Application No. 10-2014-7014579, dated Jun. 19, 2015, 13 pgs.
Chen, Yaow-Ming, Multiinput Converter With Power Factor Correction, Maximum Power Point Tracking, and Ripple-Free Input Currents, IEEE Transactions on Power Electronics, vol. 19, No. 3, May 204, pp. 631-639.
Sefa, Ibrahim et al., Experimental Study of Interleaved MPPT Converter for PV Systems, IECON 2009, 35th Annual Conference of IEEE Industrial Electronics, Nov. 3-5, 2009, pp. 456-461.
US Office Action in U.S. Appl. No. 12/711,040, dated Jun. 18, 2015, 37 pgs.
US Restriction Requirement in U.S. Appl. No. 13/664,885, dated Jul. 10, 2015, 5 pgs.
US Restriction Requirement in U.S. Appl. No. 13/957,227, dated Jun. 3, 2015, 7 pgs.

\* cited by examiner

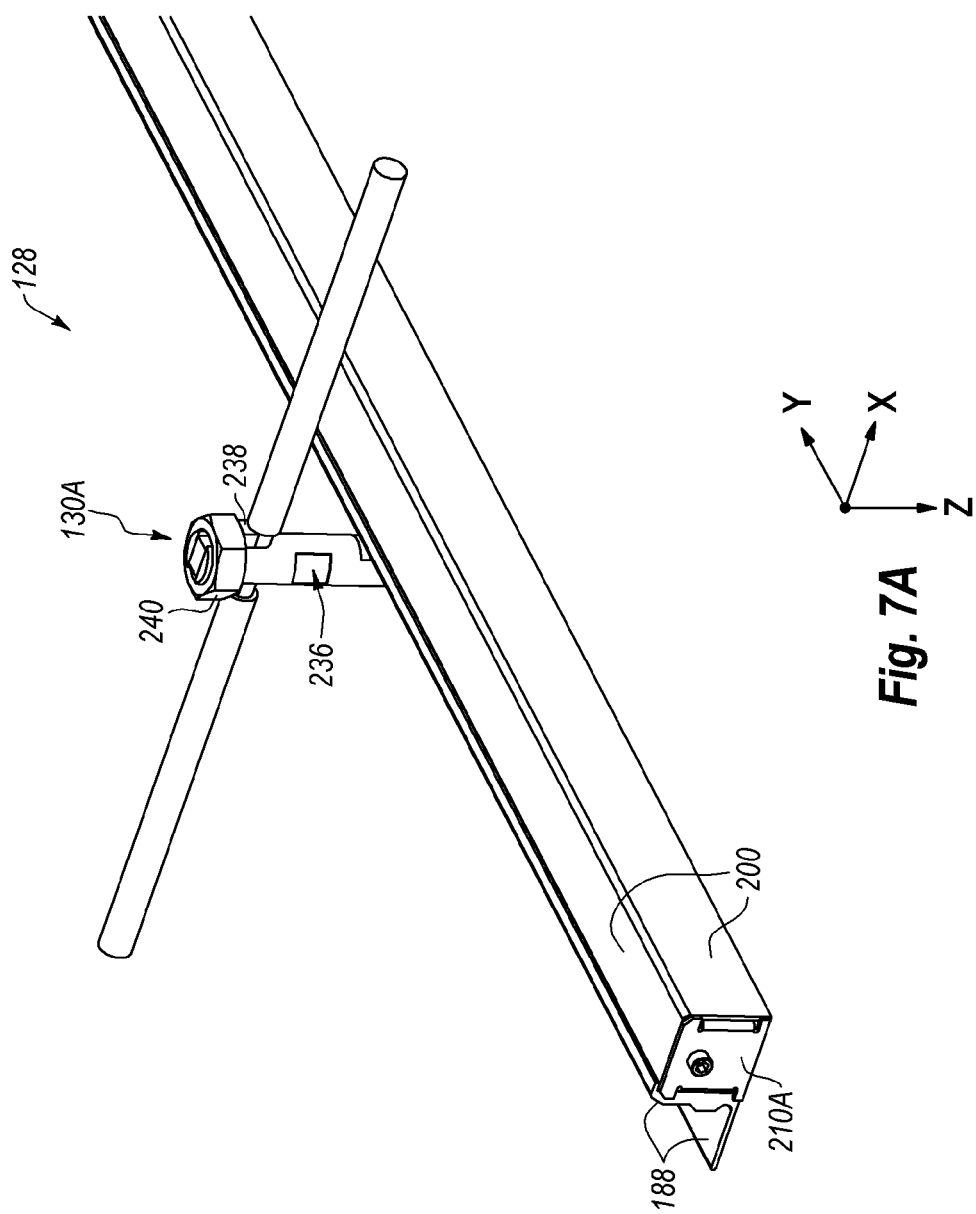

ILLUMINATION AGNOSTIC SOLAR PANEL

CROSS-REFERENCE TO RELATED APPLICATIONS

This patent application is a divisional of U.S. patent application Ser. No. 12/815,913, filed Jun. 15, 2010.

U.S. patent application Ser. No. 12/815,913:

(i) claims the benefit of and priority to U.S. Provisional Patent Application Ser. No. 61/187,202, filed Jun. 15, 2009 for SOLAR MODULE;

(ii) claims the benefit of and priority to U.S. Provisional Patent Application Ser. No. 61/220,035, filed Jun. 24, 2009 for INTEGRATED LOW-COST SOLAR MODULE;

(iii) claims the benefit of and priority to U.S. Provisional Patent Application Ser. No. 61/248,136, filed Oct. 2, 2009 for SMALL FORM-FACTOR SOLAR MODULE;

(iv) claims the benefit of and priority to U.S. Provisional Patent Application Ser. No. 61/249,778, filed Oct. 8, 2009 for RAIS SOLAR MODULES;

(v) claims the benefit of and priority to U.S. Provisional Patent Application Ser. No. 61/249,783, filed Oct. 8, 2009 for WALL-MOUNTED SOLAR MODULES;

(vi) claims the benefit of and priority to U.S. Provisional Patent Application Ser. No. 61/345,446, filed May 17, 2010 for PHOTOVOLTAIC SOLAR COLLECTOR MODULE; and (vii) is a continuation-in-part of U.S. patent application Ser. No. 12/357,260, filed Jan. 21, 2009 for REDUNDANT ELECTRICAL ARCHITECTURE FOR PHOTOVOLTAIC MODULES.

All of the above-identified patent applications are hereby incorporated herein by reference in their entirety.

BACKGROUND

Field of the Invention

The present invention relates generally to solar energy production. More particularly, some example embodiments relate to a photovoltaic ("PV") module suitable for operation under non-uniform illumination conditions.

Related Technology

There are two main types of solar collectors, including silicon and thin films, commonly used in PV panels, the solar collectors commonly composed of PV cells. Silicon is currently the predominant technology, and can generally be implemented as monocrystalline or polycrystalline cells encapsulated behind a transparent glass front plate. Thin film technology is not as wide-spread as the silicon technology due to its reduced efficiency, but it is gaining in popularity due to its lower cost.

Currently, the solar energy industry is looking for ways to decrease the cost per unit of energy generated by PV panels. One approach to reducing cost per unit energy is to increase the exposure of the PV panel to solar energy over time. For example, the orientation of the PV panel relative to the sun can be adjusted throughout the day and/or throughout the year. Changing the orientation of the PV panel relative to the sun throughout the day and/or year requires adjustable mounting systems that are costly and/or complicated with parts prone to failure over the lifetime of the PV panel.

Another approach to reducing the cost per unit energy of a PV panel is to reduce the solar collector density of the PV panel and concentrate solar energy incident on the PV panel on the remaining solar collectors. However, conventional PV panels are typically very sensitive to and perform poorly under non-uniform illumination conditions that can be associated with reflector systems.

The subject matter claimed herein is not limited to embodiments that solve any disadvantages or that operate only in environments such as those described above. Rather, this background is only provided to illustrate one exemplary technology area where some embodiments described herein may be practiced

BRIEF SUMMARY OF SOME EXAMPLE EMBODIMENTS

In general, some embodiments disclosed herein relate to PV modules suitable for use under non-uniform illumination conditions.

In one example embodiment, a PV module includes a plurality of discrete PV cells arranged in a plurality of cell rows, and a substantially electrically conductive and continuous area backsheet. The PV cells in each cell row are electrically connected in parallel to each other. The cell rows are electrically connected in series to each other and include a first row and a last row. The backsheet forms a current return path between the first and last rows. The PV cells are configured such that, in operation, current flows substantially uni-directionally through the plurality of PV cells between the first row and the last row.

In another example embodiment, a PV module includes a plurality of PV cells, a substantially electrically conductive backsheet, an electronics assembly, and two terminals. The PV cells are arranged in a plurality of cell rows, the PV cells in each cell row being connected in parallel to each other and the cell rows being connected in series to each other such that, in operation, current flows substantially uni-directionally through the PV cells, the cell rows including a first row and a last row. The backsheet forms a current return path between the last and first rows and includes a first end electrically connected to the first row of PV cells through the electronics assembly and a second end connected to the last row of PV cells. The electronics assembly is attached to the first end of the backsheet and includes a plurality of power conversion circuits and a housing extending substantially parallel to the first end of the backsheet. Each terminal extends in a direction substantially orthogonal to a major surface of the backsheet and has a contact area of at least six square millimeters.

In yet another example embodiment, a method of commencing operation in a PV module includes electrically isolating a plurality of PV cells and power conversion circuits of the PV module from an external circuit including an external negative line and an external positive line respectively connected to an internal negative line and internal positive line of the PV module. Prior to commencing operation of the PV module, a line potential across the external negative and positive lines is determined. It is determined whether the external circuit includes a battery based on the determined line potential. If it is determined that the external circuit includes a battery, operation of the PV module is initialized consistent with the external circuit including a battery. Or, if it is determined that the external circuit lacks a battery, it is determined that the external circuit includes an inverter, and operation of the PV module is initialized consistent with the external circuit including an inverter.

In yet another example embodiment, a method of controlling power output generated by a PV module includes measuring module output power collectively generated by a plurality of power conversion circuits of the PV module characterized by a module power output curve having a peak. A current measured output power is compared to a preceding measured output power. Based on a preceding direction variable indicating a side of the peak on which the PV module was previously operating and the comparison of the current measured output power to the preceding measured output power: a current direction variable indicating a side of the peak on which the PV module is currently operating is determined, and a switching period of the power conversion circuits is adjusted.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 7A is an isometric view of an electronics assembly of the PV module of FIGS. 2A and 2B;

DETAILED DESCRIPTION OF SOME EXAMPLE EMBODIMENTS

Embodiments of the invention generally relate to an illumination agnostic PV module having a plurality of PV cells and a conductive backsheet. As used herein, the term "illumination agnostic" as applied to PV modules indicates relative insensitivity of the PV modules to non-uniform illumination conditions. In some embodiments, the relative insensitivity of the PV modules to non-uniform illumination conditions results from an arrangement of the PV cells in which current flows substantially uni-directionally through the PV cells and the backsheet provides a current return path.

I. Example Operating Environment

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

Figure 1:
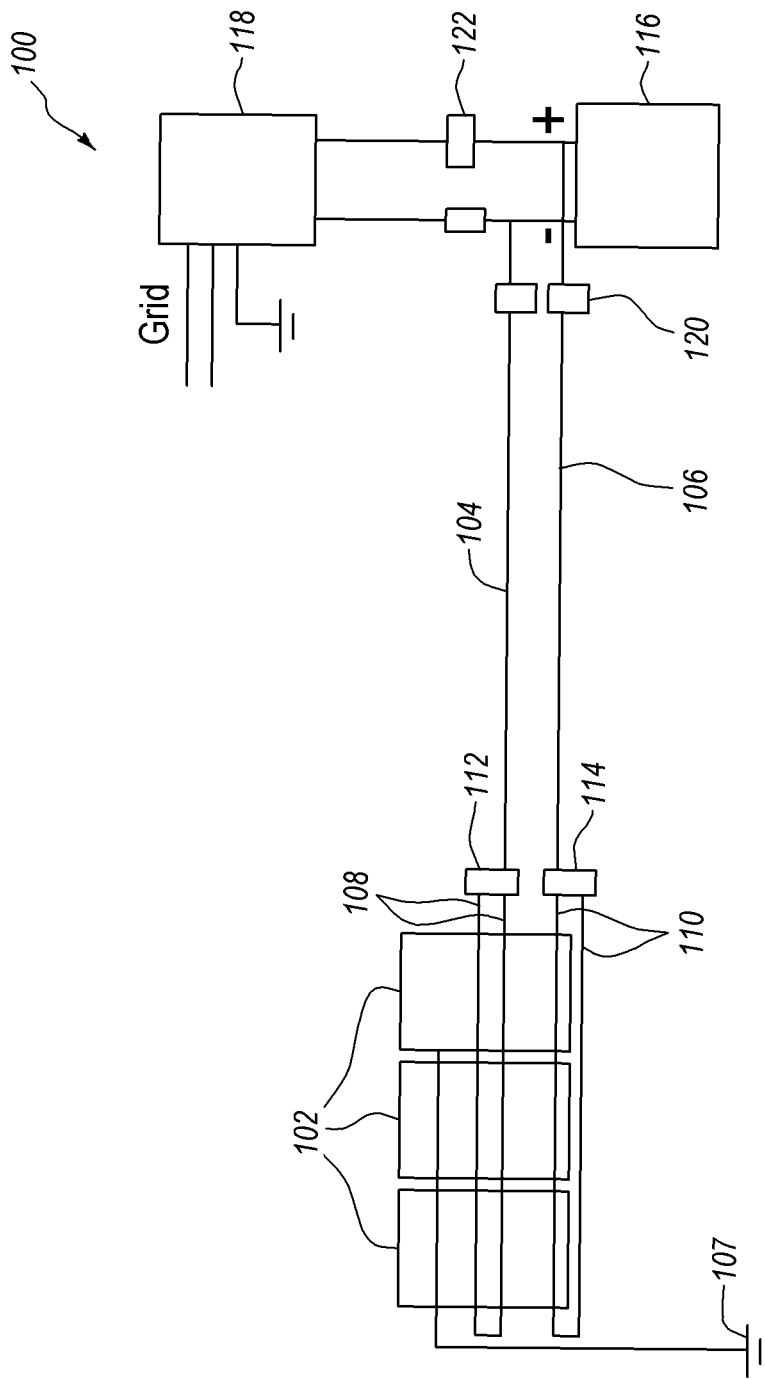
FIG. 1 illustrates an example operating environment including one or more PV modules according to some embodiments.

Turning first to FIG. 1, an example operating environment 100 is illustrated in which some embodiments disclosed herein can be implemented. The example operating environment 100 includes a plurality of PV modules 102 electrically connected in parallel to each other, with negative terminals (not shown) of the PV modules 102 being connected to an external negative line 104 and positive (or negative) terminals (not shown) of the PV modules 10 being connected to an external positive (or negative) line 106. Additionally, the PV modules 102 are connected to ground 107. Although the example operating environment 100 includes three PV modules 102, in other embodiments, the example operating environment 100 is implemented with as few as one PV module 102 or more than three PV modules 102.

Optionally, the PV modules 102 are connected in parallel to each other using conductors 108, 110 in a looped configuration to avoid losses and provide redundancy. In particular, conductor 108 is connected to negative terminals of PV modules 102 and loops back to a splice block 112 which connects the two ends of the conductor 108 to the external negative line 104. Analogously, conductor 110 is connected to positive terminals of PV modules 102 and loops back to a splice block 114 which connects the two ends of the conductor 110 to the external positive line 106.

The example operating environment 100 further includes a battery 116, inverter 118, and one or more disconnect and over-current protection devices 120, 122. The battery 116 is optional and is not required in all embodiments. In some embodiments, the inverter 118 is a hybrid inverter configured to use a battery and provide significant storage, while in other embodiments, the inverter 118 is a low voltage inverter and is configured with sufficient storage for a real-time grid feed and is further configured to discontinue if the grid stops.

Alternately or additionally, disconnect and over-current protection device 120 is a circuit breaker rated for approximately 80 amps ("A") and disconnect and over-current protection device 122 is a circuit breaker rated for approximately 100 A.

FIG. 1 further illustrates a connection to the grid. The connection to the grid is optional and not required in all embodiments.

In some embodiments, the PV modules 102 are configured to generate approximately 48 volt ("V") direct current ("DC") power. The 48V DC power charges the battery 116 and/or is converted to 120V alternating current ("AC") power by the inverter 118 for output to a power grid.

II. Example PV Module

With additional reference to FIGS. 2A-9B, aspects of an example PV module 102 that can be implemented in the example operating environment 100 of FIG. 1 are disclosed according to some embodiments.

A. General Aspects of Some PV Modules

Figure 2A:
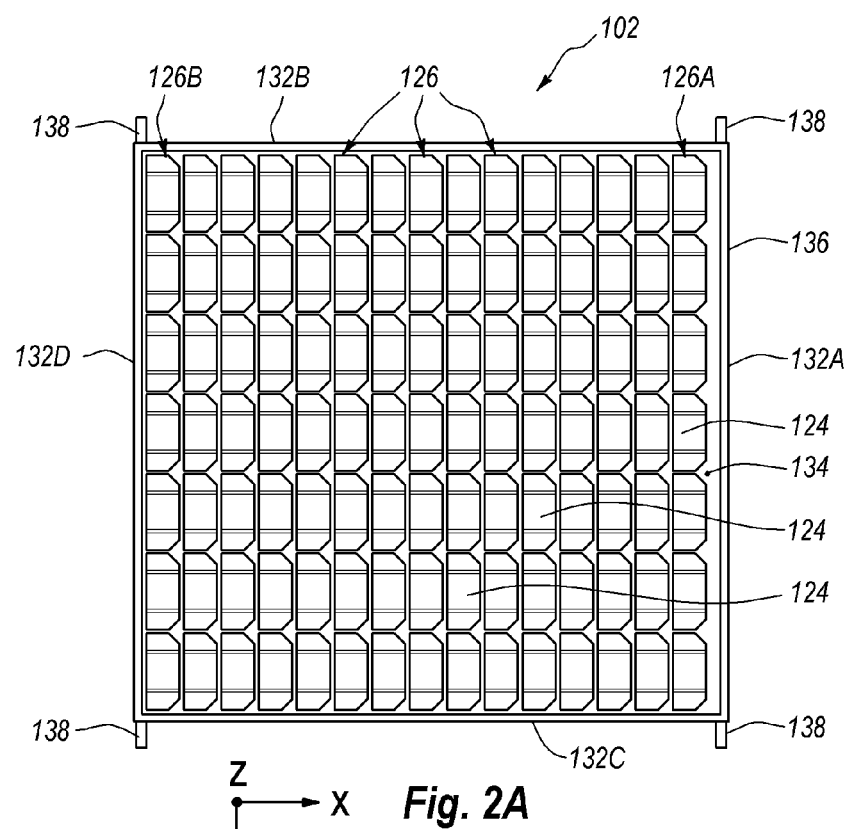
FIGS. 2A and 2B are a front view and a back view of an example PV module that may be implemented in the example operating environment of FIG. 1.
Figure 2B:
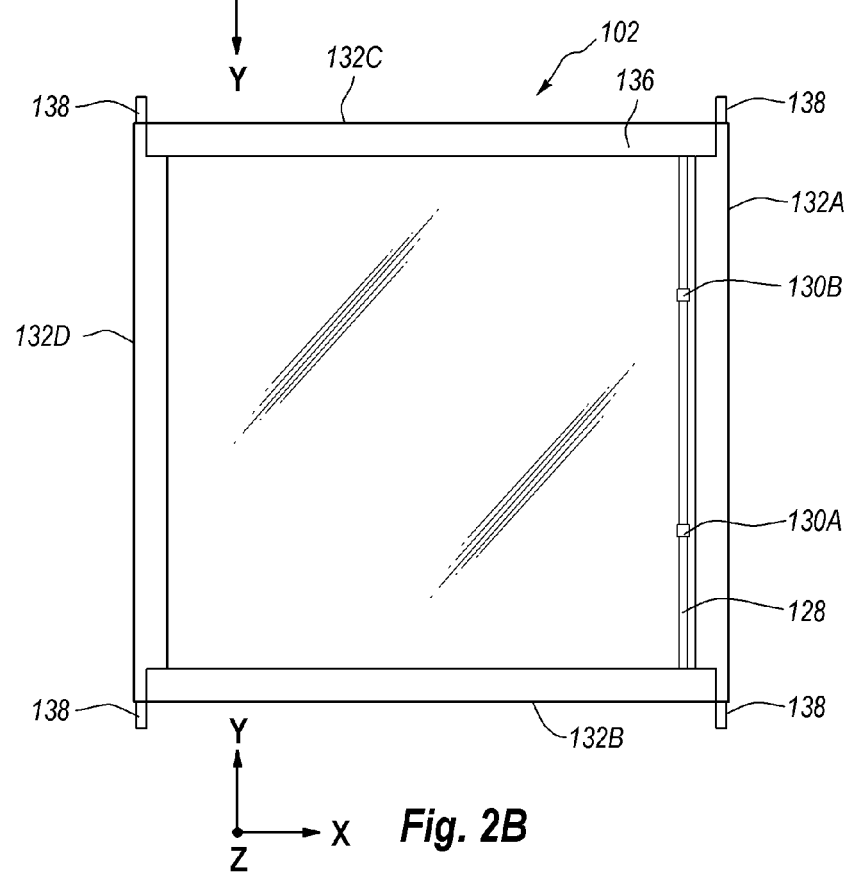

FIGS. 2A and 2B include a front view and a back view of the PV module 102. As best seen in FIG. 2A, the PV module 102 includes a plurality of discrete PV cells 124 arranged in a plurality of cell rows 126. The cell rows 126 include a first row 126A and a last row 126B. Further, the cell rows 126 are arranged side-by-side and the PV cells 124 and cell rows 126 are electrically connected such that, in operation, current generally flows uni-directionally through the PV cells 124. In the example of FIG. 2A, for instance, current generally flows through all of the PV cells 124 from left to right, corresponding to the arbitrarily-defined positive x-direction.

As best seen in FIG. 2B, the PV module 102 includes an electronics assembly 128 with terminals 130A, 130B (generically referred to in the singular or plural as "terminal 130" or "terminals 130"). In the illustrated embodiment, the terminals 130 and electronics assembly 128 are disposed on or near a first edge 132A of the PV module 102, the PV module 102 further including second, third and fourth edges 132B-132D that together with first edge 132 form a perimeter of the PV module 102. According to some embodiments, the terminals 130 are equally spaced along the first edge 132A between the second and third edges 132B, 132C. In particular, terminal 130A and terminal 130B are located along the first edge 132A at approximately one-third and two-thirds of the distance from the second edge 132B to the third edge 132C, respectively.

Terminal 130A is a negative terminal in the illustrated example. Terminal 130B may be a positive or negative terminal depending on the configuration of the PV module 102. In the illustrated embodiment, terminal 130B is a positive terminal.

Optionally, and with reference to FIG. 2A, the electronics assembly includes a light emitting diode ("LED") 134 viewable from the front of the PV module 102. The LED 134 permits performance and/or diagnostic data regarding the PV module 102 to be optically communicated to a viewer and/or a device including an optical receiver. Such data may be stored at least initially in an electronically erasable and programmable read-only memory ("EEPROM") or other suitable storage medium of electronics assembly 128 before being communicated. Performance data may include, for example, current power, periodic power profiles (e.g., by minute, hour, or the like) for a predetermined preceding time period (e.g., 24 hours), stopping and/or starting times, cumulative energy produced per day, temperature, or the like. Diagnostic data may include, for example, out-of-range voltage data, ground fault detection data, module fault data, insufficient illumination data, FW revision, current operating power, system voltage, PWM value, panel voltage, high and low side current, or the like.

Alternately or additionally, performance data and/or diagnostic data are communicated to the inverter 118 or other head-end device through external lines 104, 106. In these and other examples, data is communicated as a sequence of digital pulses on the external lines 104, 106 to the inverter 118 or other head-end device. Optionally, the digital pulses are sent by each PV module 102 to the inverter 118 or other head-end device at the end of each day when illumination is no longer sufficient to completely power the PV modules 102. In some examples, each PV module 102 includes an identifier, such as a unique serial number individually identifying the corresponding PV module 102, at the beginning or end of the corresponding sequence of digital pulses generated by the PV module 102.

With combined reference to FIGS. 2A and 2B, the PV module 102 further includes a frame 136 extending around all or a portion of the perimeter of the PV module 102. Although not required, the PV module 102 as illustrated in FIGS. 2A-2B includes frame extensions 138 disposed at the four corners of the frame 136 for use in interconnecting the PV module 102 in an array of multiple PV modules 102. Additional details regarding frame extensions and PV module arrays are disclosed in U.S. patent application Ser. No. 12/711,040 filed Feb. 23, 2010 and entitled HIGHLY EFFICIENT RENEWABLE ENERGY SYSTEM which application is herein incorporated by reference in its entirety.

Figure 3A:
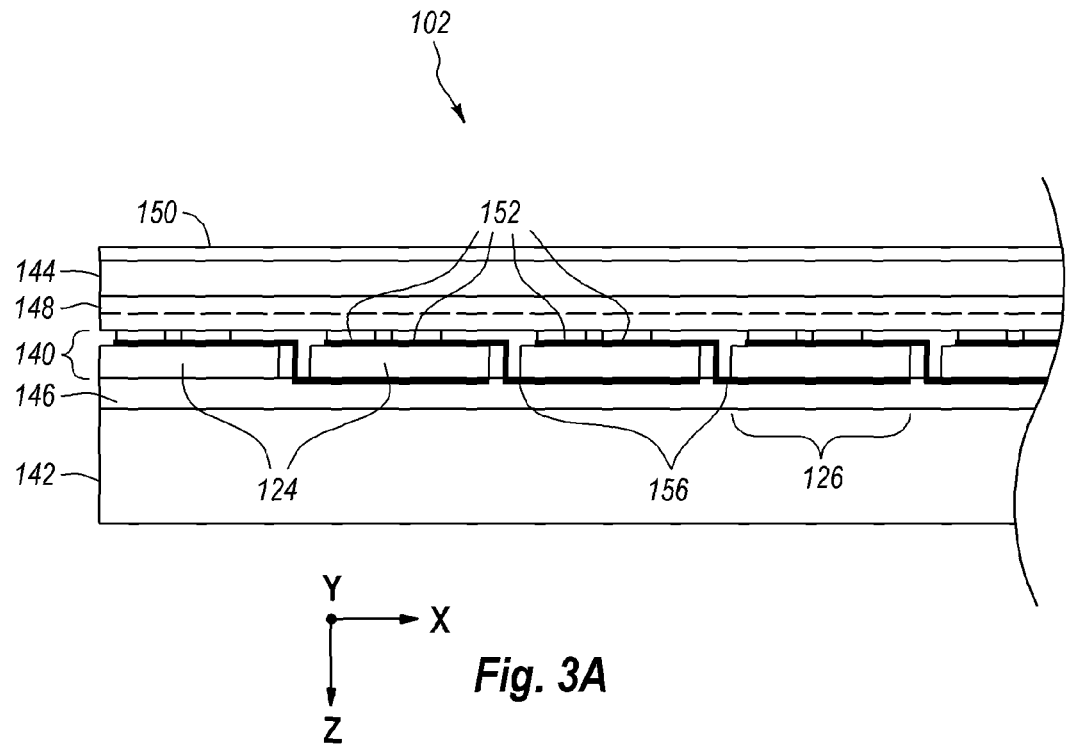
FIG. 3A is a cross-sectional side view of a portion of the PV module of FIGS. 2A and 2B.
Figure 3B:
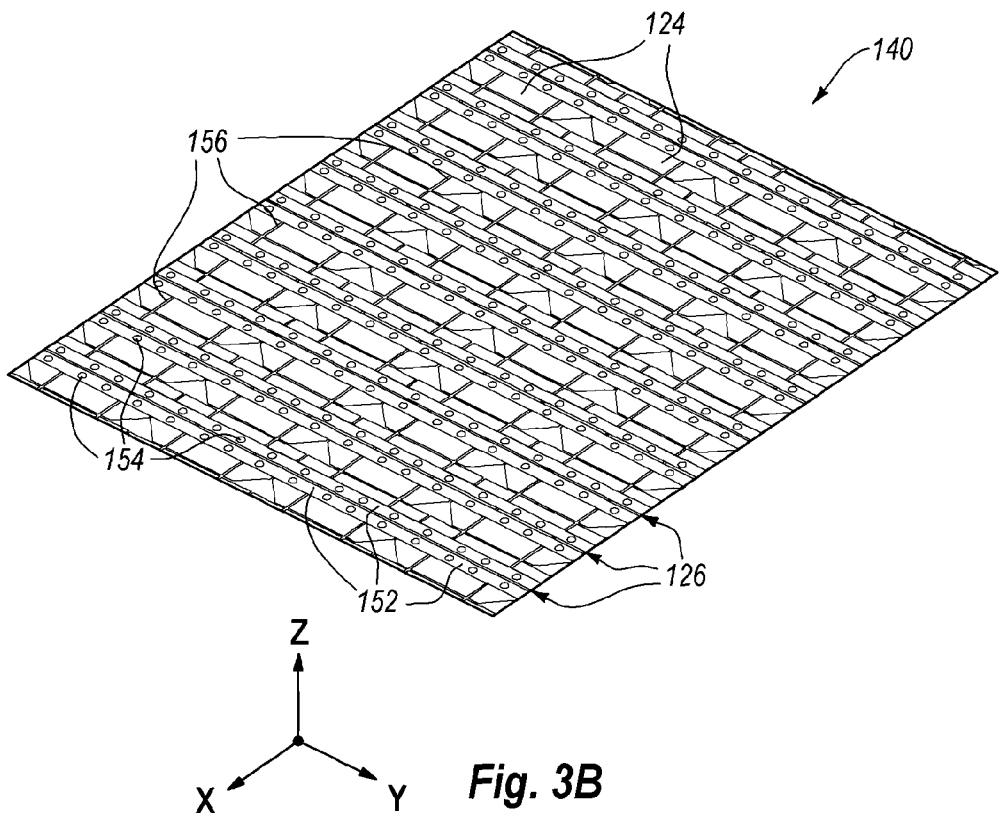
FIG. 3B is a back isometric view of a portion of a PV cell layer included in the PV module of FIGS. 2A and 2B.

FIG. 3A is a cross-sectional side view of a portion of the PV module 102 including a cell layer 140 made up of the PV cells 124 arranged in cell rows 126 as well as various conductors described in more detail below for electrically interconnecting the PV cells 124. FIG. 3B is a back isometric view of a portion of the PV cell layer 140. In the view of FIG. 3A, the cell rows 126 are oriented in and out of the page. As such, in FIG. 3A, each of the depicted PV cells 124 belongs to a different cell row 126 than the immediately adjacent PV cells 124.

As seen in FIG. 3A, the PV module 102 includes a front plate 142 disposed in front of the cell layer 140 and a backsheet 144 disposed behind the cell layer 140. As used herein, the term "front" as applied to the PV module 102 refers to the side of the PV module 102 through which light is received by the PV cells 124 within cell layer 140. The term "back" as applied to the PV module 102 refers to the side of the PV module 102 opposite the front. Terms such as "in front of," "behind," and the like are used herein consistent with the foregoing definitions of "front" and "back" as applied to the PV module 102.

Optionally, the PV module 102 further includes one or more adhesive layers 146, 148 for sealing the cell layer 140 between the front plate 142 and backsheet 144, and/or a protective film 150 substantially covering the back of the backsheet 144. Generally, the backsheet 144 forms a current return path for the PV cells 124. According to some embodiments, the one or more adhesive layers 146, 148 include ethylene-vinyl acetate ("EVA").

With combined reference to FIGS. 3A and 3B, the PV cells 124 within each cell row 126 are electrically connected in parallel to each other via conductive strips 152, including at least one conductive strip 152 per cell row 126. In the example of FIGS. 3A-3B, the PV module 102 includes a pair of two conductive strips 152 per cell row 126. Each conductive strip 152 is connected to a back side of every PV cell 124 within a corresponding cell row 126. In some embodiments, each of conductive strips 152 is between about 0.02 to 0.2 mm thick, between about 0.05 to 2 centimeters ("cm") wide, and about the same length as a corresponding cell row 126.

Optionally, each of conductive strips 152 includes a plurality of perforations 154 formed therein. The purpose served by the perforations 154 will become apparent after the following explanation regarding an example manufacturing process for PV module 102. In some embodiments, the PV module 102 is manufactured by stacking the front plate 142, a first sheet adhesive corresponding to adhesive layer 146, cell layer 140, a second sheet adhesive corresponding to adhesive layer 148 and backsheet 144 and laminating the stack. During lamination, the material of the first and second sheet adhesives migrates and conforms to (e.g., fills in) the space between the corresponding adjacent layers, ultimately forming adhesive layers 146, 148. In the event unfilled air gaps are present between the layers of the PV module 102 after lamination, reliability and/or thermal problems can arise with the PV module 102.

The perforations 154 substantially prevent unfilled air gaps from forming between the conductive strips 152 and the PV cells 124, even though no adhesive material is placed between the conductive strips 152 and the PV cells 124 prior to lamination. In particular, the perforations 154 permit the material of the second sheet adhesive corresponding to adhesive layer 148 to migrate through the perforations 154 into and fill any gaps between the conductive strips 152 and the PV cells 124 during the lamination process.

With continued reference to FIGS. 3A-3B, the cell rows 126 of PV module 102 are electrically connected in series to each other via serial interconnects 156. Particularly, each of the serial interconnects 156 electrically connects a front or positive surface of a PV cell 124 in one cell row 126 to a back or negative surface of an immediately adjacent PV cell 124 in an immediately adjacent cell row 126. In the illustrated embodiment, and as best seen in FIG. 3B, the PV module 102 includes two serial interconnects 156 per pair of immediately adjacent PV cells 124, although the PV module 102 may include more or fewer than two serial interconnects 156 per pair in other embodiments.

B. Backsheet

The backsheet 144 is made of a substantially electrically conductive material such as aluminum, aluminum alloy, or other suitable material(s). In some embodiments, the backsheet 144 is an aluminum alloy of grade 1145-H19 or 1235-H19. According to these and other embodiments, a tensile yield strength of the backsheet 144 is in a range of 120 to 200 Mega Pascals ("MPa"). More generally, the tensile yield strength of the backsheet 144 is at least 30 MPa. Alternately or additionally, the backsheet 144 is between 0.02 to 0.2 millimeters ("mm") thick.

Additionally, the backsheet 144 is a continuous area backsheet. As will be explained in further detail below, the backsheet 144 forms a current return path between the first and last cell rows 126A, 126B. As used herein, the term "continuous area" as applied to the backsheet 144 means that the area of the backsheet 144 between its interconnections with the first and last cell rows 126A, 126B is substantially continuous.

In some examples, the laminated combination of the backsheet 144 with the front plate 142 provides an optimal compressive stress level across all the PV cells 124. This compressive stress is super-imposed on the native stress state of the PV cells 124 in some embodiments and acts to reduce and/or substantially eliminate micro-crack growth within the PV cells 124. Alternately or additionally, the combination of the backsheet 144 and the front plate 142 maintains a positive camber on the front face of the PV module 102 for added strength, substantially eliminates the likelihood of the PV module 102 experiencing plastic deformation at extreme temperatures while permitted elastic deformations, and has very high bonding strength to the PV module 102 using EVA or other suitable adhesive.

In the illustrated embodiment, the backsheet 144 includes a first end 158 and a second end 160. The first end 158 and second end 160 of backsheet 144 are respectively disposed near the first and last cell rows 126A, 126B in the PV module 102. The first end 158 of the backsheet 144 is connected through the electronics assembly 128 to the first cell row 126A and the second end 160 of the backsheet is connected to the last cell row 126B. As such, and as already indicated above, the backsheet 144 forms a current return path for the PV cells 124 of PV module 102. In particular, and as best seen in FIG. 4 illustrating a cross-sectional side view of opposing ends of the PV module 102, the backsheet 144 forms a current return path between the first and last cell rows 126A, 126B.

Figure 4:
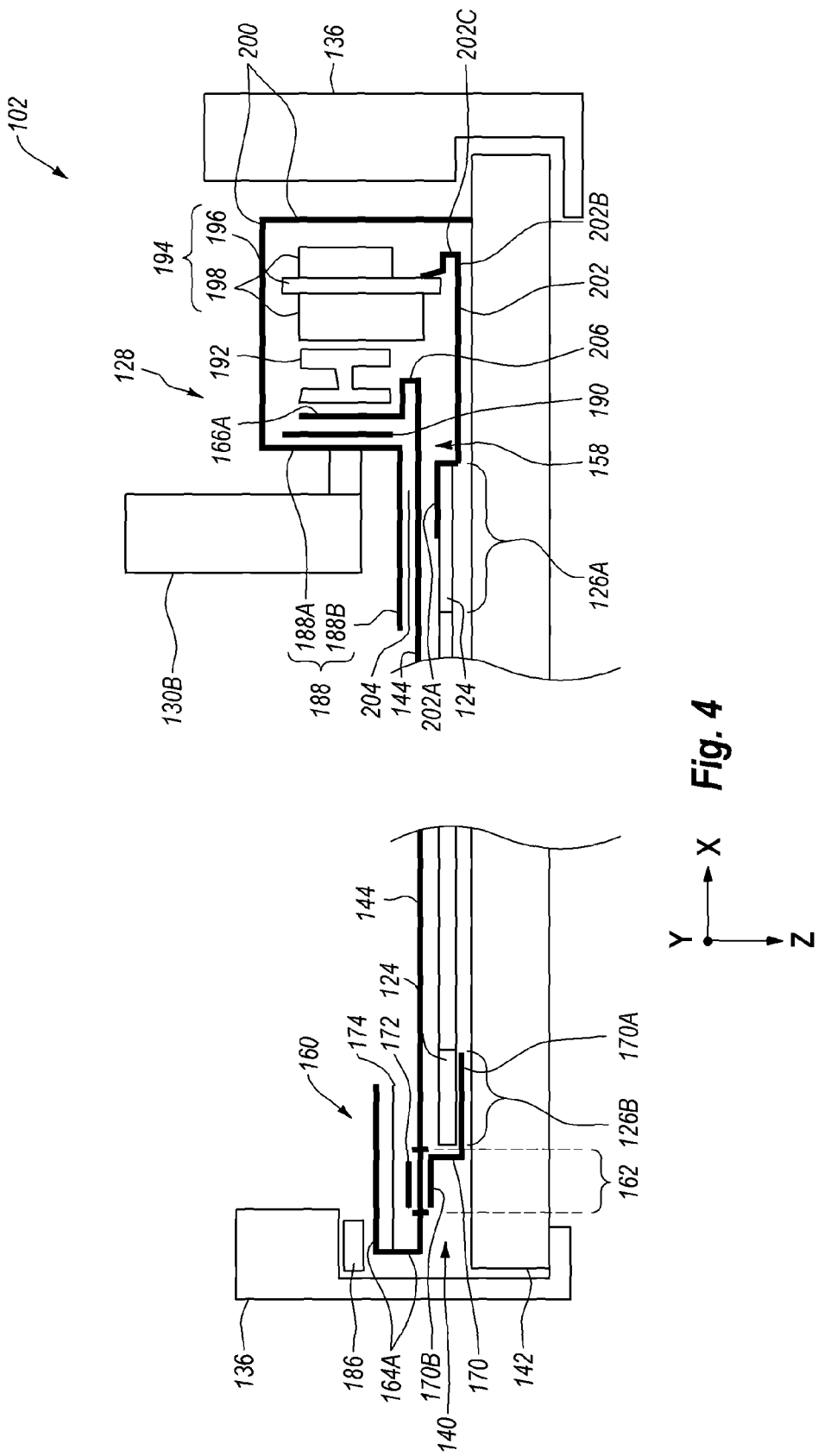
FIG. 4 is a cross-sectional side view of opposing ends of the PV module of FIGS. 2A and 2B.
Figure 5:
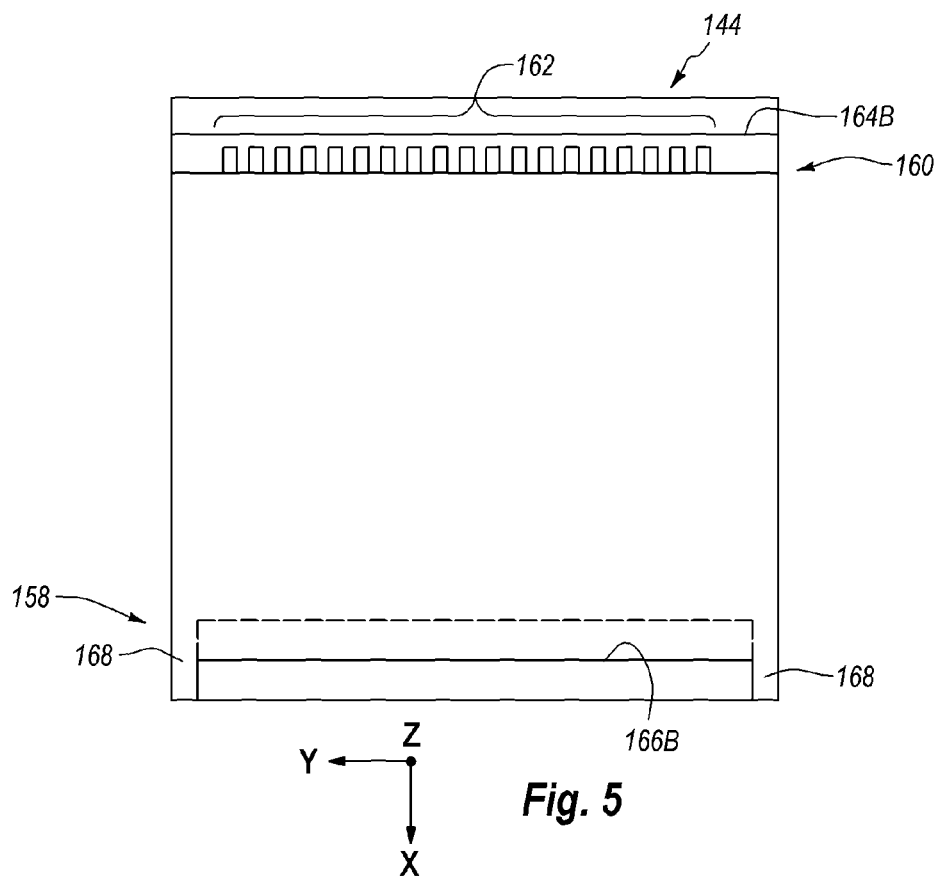
FIG. 5 is a front view of a backsheet of the PV module of FIGS. 2A and 2B.

With combined reference to FIGS. 4 and 5, the backsheet 144 includes a hole pattern 162 and first fold 164A (FIG. 4) formed at the second end 160 along the width of the backsheet 144. Prior to formation of the first fold 164A illustrated in FIG. 4, one or more first fold lines 164B may be formed in the backsheet 144 as illustrated in FIG. 5. The one or more first fold lines 164B may include weakening of the backsheet 144 along the one or more first fold lines 164B to ensure the backsheet 144 folds in a pre-defined manner to create first fold 164A.

The backsheet 144 further includes a second fold 166A (FIG. 4) formed at the first end 158 substantially along the width of the backsheet 144. Prior to formation of the second fold 166A illustrated in FIG. 4, one or more second fold lines 166B may be formed in the backsheet 144 as illustrated in FIG. 5. Optionally, one or more tabs 168 are formed in two corners of the backsheet 144 by slitting the backsheet 144 from the edge of the first end 158 up to one of the one or more second fold lines 166B.

As best seen in FIG. 4, the PV module 102 further includes first interconnecting member 170 and one or more solder strips 172 for interconnecting the second end 160 of the backsheet 144 to the last cell row 126B. The first interconnecting member 170 extends about the length of the last cell row 126B and includes first and second sides 170A, 170B. The first side 170A of first interconnecting member 170 is electrically connected to each of the PV cells 124 within last cell row 126B. The second side 170B of the first interconnecting member 170 is disposed in front of the hole pattern 162 formed in the backsheet 144.

The solder strip 172 extends about the length of the hole pattern 162 formed in the second end 160 of the backsheet 144. The solder strip 172 is disposed on a backside of the backsheet 144 in the region of the backsheet 144 including the hole pattern 162. For instance, the solder strip 172 may be disposed on the backside of the backsheet 144 immediately behind the hole pattern 162. The solder strip 172 is soldered to the second side 170B of the first interconnecting member 170 through holes of the hole pattern 162. As such, each of the PV cells 124 within the last cell row 126B is electrically connected to the second end 160 of the backsheet 144 through the first interconnecting member 170 and the solder strip 172.

In the illustrated embodiment, the fold 164A covers the solder strip 172 and a sealant 174 is disposed between the solder strip 172 and the fold 164A. The sealant 174 is substantially compliant in some embodiments. Alternately or additionally, the sealant is butyl rubber, solar edge tape, or other compliant sealant. Generally, the sealant 174 is configured to prevent moisture penetration into the PV module 102 through the electrical and mechanical interconnection formed between the backsheet 144 and the last cell row 126B. According to some embodiments, the sealant 174 is positioned between the solder strip 172 and the fold 164A prior to lamination and is formed and shaped into the PV module 102 during the high temperature and pressure of the lamination process to ensure a good seal. Alternately or additionally, the hole pattern 162 allows excess adhesive such as EVA to escape from within the PV module 102 during the lamination process to ensure a low profile and integral seal around the entire interconnection between the backsheet 144 and the last cell row 126B.

Although not shown in FIG. 4, the PV module 102 may further include protective film 150 (FIG. 3A) substantially covering the backsheet 144, including covering all or a portion of the fold 164A. In some embodiments, the protective film 150 is black polyethylene terephthalate ("PET"), black poly methyl methacrylate ("PMMA"), or other suitable material. Alternately or additionally, the protective film 150 is substantially electrically insulating and/or has an emissivity greater than 0.6. The relatively high emissivity of the protective film 150 in these and other embodiments allows the protective film to radiate thermal energy away from the PV module 102 for thermal management of the PV module 102.

In view of the foregoing, the electrical and mechanical interconnection between the backsheet 144 and the last cell row 126B is formed in the following manner according to some embodiments. First, the hole pattern 162 and one or more first fold lines 164B are formed in the second end 160 of the backsheet 144. Next, the solder strip 172 is soldered to the second side 170B of the first interconnecting member 170 through the hole pattern 162 to form the electrical and mechanical interconnection. The sealant 174 is placed on the solder strip 172, followed by folding the second end 160 of the backsheet 144 over the solder strip 172 and sealant 174 along first fold line 164B to form first fold 164A. Next, the protective film 150 (FIG. 3A) is placed on the back of the backsheet 144. Some or all of the foregoing steps may be performed prior to and/or after stacking the layers of the PV module 102 illustrated in FIG. 4. Finally, after the layers of PV module 102 illustrated in FIG. 4 are stacked and the protective film 150 has been placed on the back of the backsheet 144, the stacked materials are laminated to form a PV panel, to which the frame 136 and electronics assembly 128 are attached to form PV module 102.

With continued reference to FIG. 4, the second fold 166A is oriented substantially orthogonal to a major surface of the backsheet 144. Specifically, the majority (hereinafter the "major surface") of the backsheet 144 generally defines a plane that is parallel to the arbitrarily-defined x-y plane, while the second fold 166A generally defines a plane that is parallel to the arbitrarily-defined y-z plane and is therefore oriented orthogonal to the major surface of the backsheet 144. The second fold 166A electrically connects the backsheet 144 to the first cell row 126A through the electronics assembly. Additional details regarding this interconnection are provided in section C below.

In the example of FIG. 4, the components of the PV module 102 are not drawn to scale and are represented in simplified block form. As such, some aspects of specific implementations of, e.g., the frame 136 and/or other components of the PV module 102, are not evident from FIG. 4. However, FIG. 6 discloses aspects of a specific implementation of the frame 136 according to some embodiments.

Figure 6:
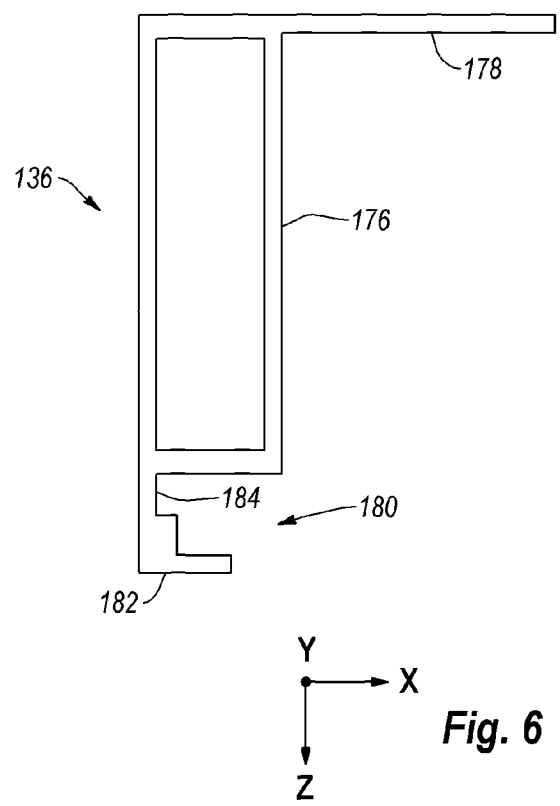
FIG. 6 is a cross-sectional view of a portion of a frame of the PV module of FIGS. 2A and 2B.

FIG. 6 is a cross-sectional view of a portion of the frame 136. The portion of the frame 136 illustrated in FIG. 6 corresponds to the portion of the frame 136 depicted on the left side of FIG. 4. Other portions of the frame 136, such as the portion of the frame 136 depicted on the right side of FIG. 4 or portions of the frame 136 depicted in FIGS. 2A-2B, are similarly configured in some embodiments, although such other portions have different orientations with respect to the arbitrarily defined x-y-z coordinate axes depending on which of edges 132A-132D (FIGS. 2A-2B) the frame 136 is disposed.

With combined reference to FIGS. 2A-2B and 6, the frame 136 extends along all four sides 132A-132D of the PV module 102. In the illustrated embodiment, the frame 136 is extruded aluminum or other suitable material(s) formed by any suitable process(es).

As best seen in the cross-sectional view of FIG. 6, the frame 136 includes a base 176, a foot 178, and a channel 180. The base 176, foot 178 and channel 180 extend the entire length of each portion of the frame 136 according to some embodiments.

The base 176 supports the layers of the PV module 102 along the perimeter of the PV module 102, including the layers identified in FIGS. 3A and/or 4 by reference numbers 140, 142, 144, 148, 150.

The foot 178 extends from the base 176 and adds bending strength to the PV module 102 and frame 136. Alternately or additionally, the foot 178 extends at least partially behind the electronics assembly 128 to provide a protective function for the electronics assembly 128.

The channel 180 is defined by the base 176 and an arm 182 extending from the base 176. In general, the channel 180 is configured to receive the material stack of the PV module 102 along the perimeter of the PV module 102. Specifically, the channel 180 is configured to receive the material stack including at least the front plate 142, adhesive layer 146, cell layer 140, adhesive layer 148, and backsheet 144. In some embodiments, the protective film 150 terminates prior to the perimeter of the backsheet 144, while in other embodiments the protective film 150 extends to the perimeter of the backsheet 144; as such, channel 180 may or may not receive the protective film 150.

Although not required, in the illustrated embodiment of FIG. 6, the channel 180 includes a recessed slot 184 configured to ensure the frame 136 does not contact an edge of the backsheet 144. For instance, with combined reference to FIGS. 4 and 6, the channel 180 is configured to accommodate therein at least the left end of the front plate 142 and the second end 160 of the backsheet 144 with the second end 160 of the backsheet 144 being vertically aligned with the recessed slot 184. The vertical alignment of the second end 160 of the backsheet 144 with the recessed slot 184 results in the horizontal distance between the second end 160 of the backsheet 144 and the frame 136 in the location of the recessed slot 184 being greater than the horizontal distance between the left end of the front plate 142 and the frame 136 in the location of the channel 180. As such, the second end 160 of the backsheet 144 will not contact the frame 136 in the location of the recessed slot 184 even if the backsheet 144 and other laminated layers of the PV module 102 horizontally shift relative the frame 136.

According to some embodiments, the PV module 102 includes an isolation strip 186 (FIG. 4) disposed between the backside of the backsheet 144 and the base 176 (FIG. 6) of the frame 136. The isolation strip is substantially electrically isolating to prevent electrical contact between the backsheet 144 and the frame 136.

Optionally, the backsheet 144 cooperates with the front plate 142 to form a barrier against moisture ingress. For instance, in comparison to backsheets made from plastic such as Tedlar and/or PET that are implemented in some PV modules, water transmission rates through the continuous area backsheet 144 made of aluminum are 4-6 orders of magnitude lower.

Additionally, some PV modules have holes cut in the backsheet to bring out electrical leads for making electrical interconnections. While attempts are made to seal such holes, such attempts are usually not 100% effective such that moisture can enter the PV module through the cut holes for the electrical leads. In contrast, the PV module 102 lacks holes for electrical leads since electrical interconnections are continuously formed along opposing ends 158, 160 of the backsheet 144 and the continuous electrical interconnections are protected within the laminate stack and/or electronics assembly. Thus, there are no holes cut in exposed portions of the backsheet 144 through which moisture can penetrate, further preventing moisture ingress compared to PV modules with backsheets having holes formed therein to accommodate electrical leads.

C. Electronics Assembly

Referring again to FIG. 4, aspects of the electronics assembly 128 are disclosed according to some embodiments. In general, the electronics assembly 128 includes a plurality of power conversion circuits (not shown) configured to convert the DC power generated by the PV cells 124 to a DC power with a stepped up voltage suitable for transmission.

In more detail, the electronics assembly 128 includes a housing 188, an electrical isolation layer 190, a second interconnecting member 192, a printed circuit board ("PCB") assembly ("PCBA") 194 including a PCB 196 and a plurality of electronics 198 such as power conversion circuits, and a removable cover 200.

In the embodiment of FIG. 4, the power conversion circuits included in electronics 198 implement p-type field effect transistors ("FETs") such that the side of the module to which the electronics assembly 128 is attached (e.g., the right side) is the positive side of the PV module 102 and the other side of the PV module 102 is the ground side of the PV module 102. In other embodiments, the power conversion circuits included in electronics 198 implement n-type FETs in which case the side of the PV module 102 to which the electronics assembly 128 is attached would be the negative side of the PV module 102 and the other side of the PV module 102 would be the ground side.

The electrical and/or mechanical interconnection between the backsheet 144 and electronics assembly is provided in some embodiments by the housing 188, electrical isolation layer 190, second fold 166A of the backsheet 144, and second interconnecting member 192. In more detail, the housing 188 extends lengthwise along at least a portion of the first end 158 of the backsheet 144 and includes a first side 188A disposed proximate and substantially parallel to the second fold 166A of the backsheet 144. The electrical isolation layer 190 is disposed between the housing 188 and the second fold 166A of the backsheet 144. The second interconnecting member 192 extends lengthwise along at least a portion of the first end 158 of the backsheet 144. The electrical isolation layer 190 and second fold 166A of the backsheet 144 are sandwiched between the first side 188A of the housing 188 and the second interconnecting member 192.

Although not shown in FIG. 4, in some embodiments, one or more slots are formed in the second fold 166A of the backsheet 144. The one or more slots permit compression-based fasteners to drop over the second fold 166A to apply pressure across the interconnection between the second fold 166A of the backsheet 144 and the second interconnecting member 192.

Electrical isolation layer 192 electrically isolates the second fold 166A of the backsheet 144 from the housing 188 in some embodiments. Alternately or additionally, the electrical isolation layer 192 is thermally conductive tape.

As can be seen in FIG. 4, the PV module 102 further includes a third interconnecting member 202 generally extending lengthwise along at least a portion of the first end 158 of the backsheet 144. The third interconnecting member 202 has first and second sides 202A, 202B. The first side 202A of third interconnecting member 202 is electrically connected to each of the PV cells 124 within the first cell row 126A. The second side 202B of third interconnecting member 202 includes a strain relief fold 202C and is electrically and mechanically connected to the PCBA 194. The strain relief fold 202C is configured to minimize strain at the interconnection between the third interconnecting member 202 and the PCBA 194, the strain resulting from, e.g., expansion, contraction and/or out-of-plane deflections of the laminate stack under variable temperature conditions.

FIG. 4 further illustrates an adhesive 204 disposed between the major surface of the backsheet 144 and a second side 188B of the housing 188. In the example of FIG. 4, the second side 188B of the housing 188 is attached to the first side 188A of the housing 188 and is disposed proximate and substantially parallel to the major surface of the backsheet 144. The adhesive 204 is configured to secure the second side 188B of the housing 188 to the major surface of the backsheet 144, thereby securing the housing 188 to the backsheet 144. The adhesive 204 is acrylic foam tape or other suitable adhesive.

Optionally, the first end 158 of the backsheet 144 includes a strain relief fold 206 formed between the major surface of the backsheet 144 and the second fold 166A. Analogous to the strain relief fold 202C, the strain relief fold 206 is configured to minimize strain at the interconnection between the second fold 166A and the second interconnecting member 192, the strain resulting from, e.g., expansion, contraction and/or out-of-plane deflections of the laminate stack under variable temperature conditions.

Although not required, in some embodiments, the face of the second fold 166A of backsheet 144 facing the second interconnecting member 192 is purposely textured. The texture of the face of the second fold 166A facing the second interconnecting member 192 ensures good electrical contact between the second fold 166A and second interconnecting member 192 while permitting the second fold 166A to be coated with a protective grease that may be relatively non-electrically-conductive. The protective grease protects the second fold 166A from oxidizing. In these and other examples, The texture of the face of the second fold 166A facing the second interconnecting member 192 penetrates through the grease to establish good electrical contact with the second interconnecting member 192.

According to some embodiments, the second interconnecting member 192 functions as a heat sink for the PCBA 194. For example, in the example of FIG. 4, the second interconnecting member 192 extends to near contact with some of the electronics 198 of the PCBA 194. Further, the second interconnecting member 192 may be made from a substantially thermally conductive material such as metal. The proximity of the second interconnecting member 192 to the PCBA 194 and the thermal properties of the second interconnecting member 192 in some examples are such that at least some of the thermal energy generated by the electronics 198 is transferred to the second interconnecting member 192. Alternately or additionally, some of the thermal energy transferred to the second interconnecting member 192 is transferred to the housing 188 and/or backsheet 144 through the second fold 166A of backsheet 144 and the electrical isolation layer 190 and then radiated away from the PV module 102. Optionally, to enhance thermal conductivity, thermally conductive grease and/or thermally conductive pads are placed in the gap between the electronics 198 and the second interconnecting member 192.

Alternately or additionally, with combined reference to FIGS. 4 and 7A, the second interconnecting member 192 functions as a bus bar between the backsheet 144 and the electronics 198. In these and other examples, the first cell row 126A is electrically connected to the PCBA 194 through third interconnecting member 202 and then grounded through the second interconnecting member 192 and second fold 166A to the backsheet 144. In some embodiments, fasteners 208 such as screws, bolts and/or nuts mechanically secure the PCBA 194 to the second interconnecting member 192 and electrically connect the PCBA 194 to the second interconnecting member 192 and thus the backsheet 144.

Figure 7B:
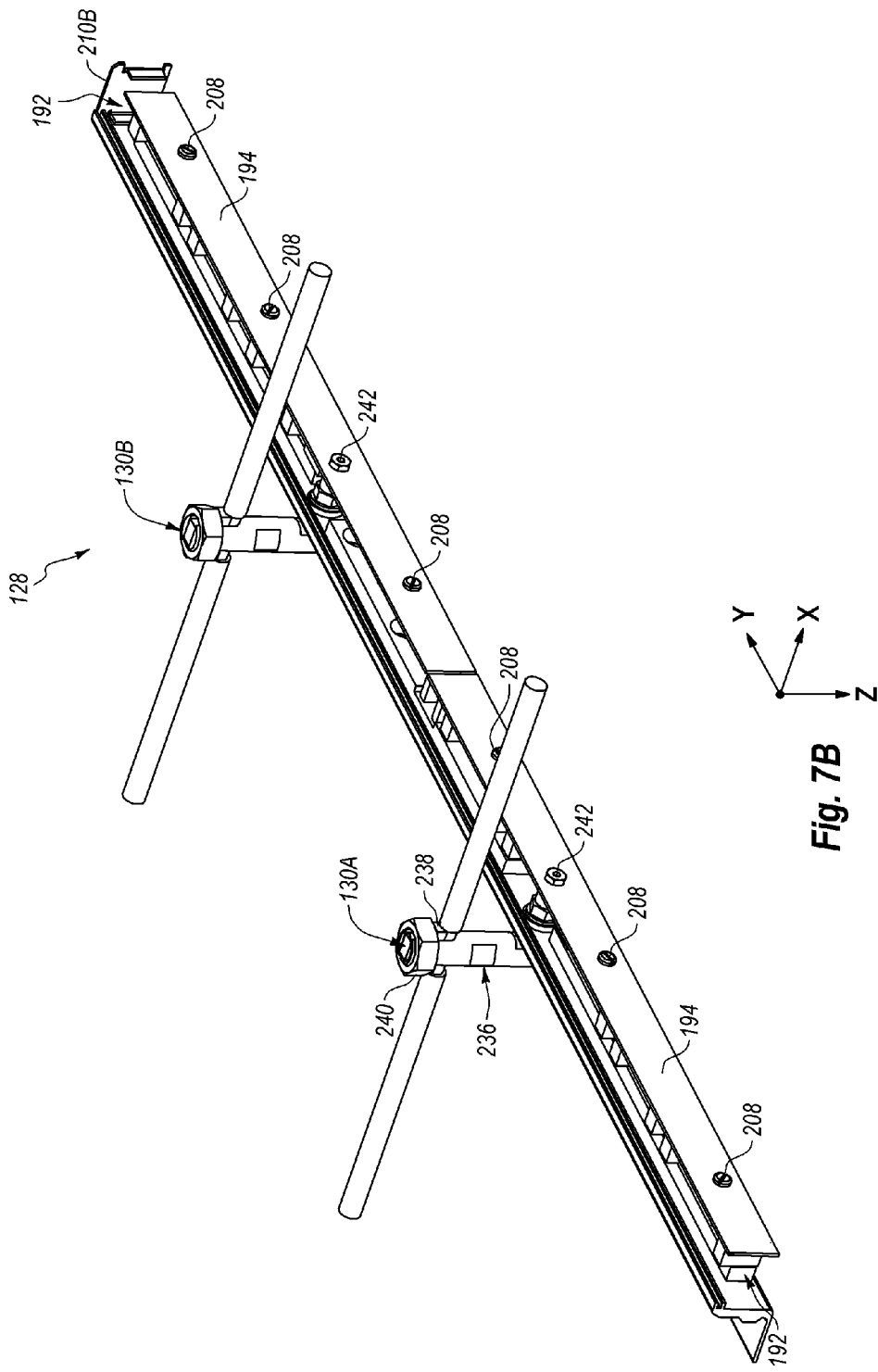
FIG. 7B is an isometric view of the electronics assembly of FIG. 7A with a cover removed to illustrate some interior details of the electronics assembly.
Figure 7C:
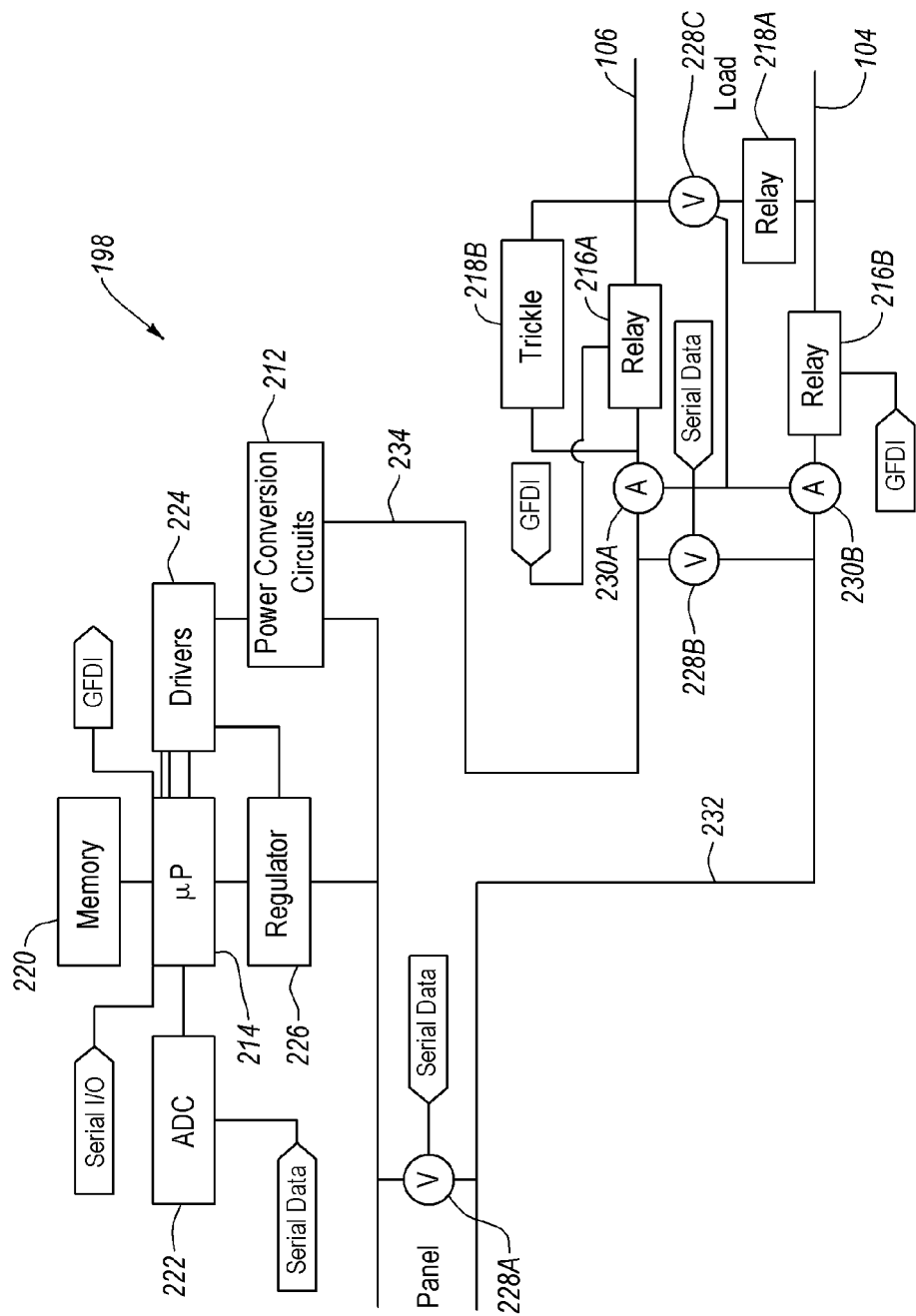
FIG. 7C is a schematic circuit diagram of some electronics included in the electronics assembly of FIG. 7A.

Additional aspects of the electronics assembly 128 are disclosed in FIGS. 7A-7C. For instance, as best seen in FIGS. 7A-7B, the electronics assembly 128 further includes end caps 210A (FIG. 7A), 210B (FIG. 7B), collectively referred to herein as "end caps 210". The removable cover 200 and end cap 210A have been omitted from FIG. 7B. The removable cover 200, end caps 210, the housing 188 and a portion of the front plate 142 cooperatively form an enclosure within which electronics 198 including power conversion circuits are disposed.

In some embodiments, the end caps 210 are vented to allow air to vent into or out of the electronics assembly 128 during rapid pressure changes. In these and other embodiments, each of end caps 210 may include one or more holes of 1 mm or less in diameter formed in the end caps 210 to permit the air to vent.

With additional reference to FIG. 7C, aspects of the electronics 198 on PCB 196 are disclosed. In particular, FIG. 7C is a circuit diagram disclosing some of the electronics 198 included on PCB 196 according to some embodiments. The electronics 198 include a plurality of power conversion circuits 212, one or more control modules 214, a plurality of power relays 216A-216B (collectively "power relays 216") and other relays 218A-218B (collectively "relays 218") and one or more volatile or non-volatile storage media 220. Alternately or additionally, the electronics 198 further include at least one analog-to-digital converter ("ADC") 222, a plurality of drivers 224, a regulator 226, voltmeters 228A-228C (collectively "voltmeters 228") and ammeters 230A-230B (collectively "ammeters 230").

Briefly, the power conversion circuits 212 provide voltage conversion of the DC output generated by the PV module 102. The control module 214 controls operation of the PV module 102 and is a controller, microcontroller, processor, microprocessor, or other suitable control module. The ADC 222 digitizes analog inputs for use by the control module 214. The regulator 226 controls the voltage supplied to digital devices within electronics 198; in some embodiments, the regulator 226 maintains the voltage supplied to the digital devices near 3.3 volts independent of how much voltage collectively generated by the PV cells 124 changes. The drivers 224 control the power conversion circuits 212; for instance, in some examples, the drivers 224 control on/off cycles of FETs implemented in power conversion circuits 212. The storage medium 220 stores firmware for operation of the PV module 102 and/or can be used by the control module 214 to store performance data and/or other data for the PV module 102. In some embodiments, the storage medium 220 is an electrically erasable and programmable read only memory ("EEPROM") or other suitable memory or storage medium.

The power relays 216 isolate the PV module 102 from external negative line 104 and external positive line 106 (collectively "external lines 104, 106") when the PV module 102 is off. Specifically, when the PV module 102 is off, power relay 216B is configured to isolate an internal negative line 232 from external negative line 232 and power relay 216A is configured to isolate an internal positive line 234 from external positive line 106. The internal negative and positive lines 232, 234 are collectively referred to herein as "internal lines 232, 234."

As used herein, the terms "internal negative line" and "internal positive line" generally refer to the conductors and/or other circuit elements within PV module 102 that are connected between the electronics 198 of electronics assembly 128 and the respective negative or positive terminal 130A or 130B of the PV module 102. Analogously, the terms "external negative line" and "external positive line" generally refer to the conductors and/or other circuit elements external to PV module 102 that are connected between an external load and the respective negative or positive terminal 130A or 130B of the PV module 102.

The relays 217 permit the PV module 102 to supply a trickle current to a load including an inverter and lacking a battery when the power relays 216 are open to equalize potential between the external lines 104, 106 and internal lines 232, 234 before closing the power relays 216 and commencing normal operation of the PV module 102. Voltmeters 228 and ammeters 230 are used to sense voltage and current at various points in the PV module 102.

Optionally, the electronics 198 further include a fast overvoltage circuit (not shown) and/or an internal ground fault interruption system, identified as "GFDI" in FIG. 7C. The fast overvoltage circuit is configured to rapidly respond to an open circuit condition for safety and for protecting internal circuits of the PV module 102. In these and other embodiments, the response time of the fast overvoltage circuit is less than, for example, 0.1 milliseconds.

The GFDI is generally configured to detect ground faults and interrupt the circuit to prevent damaging the PV module 102 and/or creating a safety hazard. Alternately or additionally, the GFDI is configured to detect specific frequencies in the voltage on the external output lines 232 that are indicative of the presence of an arc fault and shut down power production by the PV module 102. In some embodiments, the specific frequencies indicative of the presence of an arc fault and that are detectable by the GFDI are less than about 1 Hertz ("H").

1. Power Conversion Circuits

As already mentioned above, the power conversion circuits 212 provide voltage conversion of the DC power generated by the PV module 102 in order to output a conditioned power supply having a stepped up voltage and stepped down current suitable for long-distance transmission. By way of example, the PV cells 124 may collectively generate 240 watts of DC power at about 8 volts and 30 amps under normal operating conditions. Long-distance transmission of this 240-watt DC power would likely be cost-prohibitive as it would require a relatively large, and therefore expensive, conductor to handle the 30-amp current.

In the present example, however, the 240-watt collective output of PV cells 124 is divided among the power conversion circuits 212. For instance, the 240-watt output may be divided among twelve power conversion circuits 212 such that each of the twelve power conversion circuits 212 receives about 20 watts of the output at 8 volts and 2.5 amps. The power conversion circuits 212 then step up the voltage and step down the current of the respective 20-watt outputs. For example, each power conversion circuit 212 in this example steps up the voltage and steps down the current of the 20-watt output to about 54 volts and about 0.74 amps, respectively. The 54-volt and 0.74-amp outputs of the power conversion circuits 212 combine on internal positive line 234 to create a 240-watt output at 54 volts and 4.4 amps, allowing the 240-watt output to be transmitted long-distance via a relatively smaller and less expensive conductor than would otherwise be required for 240-watt DC power at 8 volts and 30 amps.

The specific numbers provided in the foregoing example are provided by way of illustration only and should not be construed to limit the invention. More generally, the voltage and peak current of the collective DC power output of the PV cells 124 in some embodiments is between about 3-12 volts and 0-60 amps, respectively. Alternately or additionally, the voltage and current of the collective DC power output by the power conversion circuits 212 on internal positive line 234 in some embodiments is between about 12-60 volts and 0-20 amps, respectively.

Each of power conversion circuits 126 is a step-up DC-DC converter with an output DC voltage that is greater than its input DC voltage. Examples of step-up DC-DC converters that can be implemented according to some embodiments include boost converters, buck-boost converters, SEPIC converters, and Ćuk converters.

Each of power conversion circuits 212 includes, among other things, an inductor, one or more capacitors, and a switch. The switch is implemented as a p-type or n-type FET in some examples. Alternately, the switch is a metal-oxide-semiconductor FET ("MOSFET"), an insulated-gate bipolar transistor ("IGBT"), a bipolar junction transistor ("BJT"), or other suitable device.

Generally, a voltage gain is produced by each of power conversion circuits 212 by cycling the switch of the power conversion circuit 212 on and off using a pulse width modulation ("PWM") control signal provided by the control module 214. The magnitude of the voltage gain depends on, among other things, the duty cycle of each power conversion circuit 212 and inductor charge time as controlled by the PWM control signal.

Optionally, the control module 214 controls the number of active power conversion circuits 212, the duty cycle and/or inductor charge time to implement maximum peak power tracking ("MPPT") for the PV module 102. Additional aspects of an example MPPT method are disclosed with respect to FIGS. 11A-12 below.

In some embodiments, the electronics 198 include twelve paired power conversion circuits. The two power conversion circuits 212 within each pair are optionally operated 180 degrees out of phase with each other. According to some embodiments, the out-of-phase operation of the power conversion circuits 212 within each pair substantially reduces current ripple at the input and output of electronics assembly 128 (FIG. 4). Alternately or additionally, the number of power conversion circuits 212 that operate at any given time may be dynamically selected, e.g., by the control module 214, based on the power level of the PV module 102.

Although not required, in some embodiments the PV module 102 is configured to take itself off-line for self maintenance. For instance, in the event one of power conversion circuits 212 is shorted, the PV module 102 is configured to take itself off-line and apply full current through the shorted power conversion circuit 212 to cause a corresponding power conversion circuit fuse to fail to thereby isolate the shorted power conversion circuit 212. After causing the fuse to fail, the PV module 102 returns to normal operation.

Additional aspects of power conversion circuits that can be implemented according to some embodiments are disclosed in U.S. patent application Ser. No. 12/357,260, filed Jan. 21, 2009 for REDUNDANT ELECTRICAL ARCHITECTURE FOR PHOTOVOLTAIC MODULES which application is herein incorporated by reference in its entirety.

2. Relays

The power relays 216, other relays 218 and voltmeters 228B, 228C permit dual-use operation of the PV module 102. The dual uses include operation with either a battery load or a battery-less inverter load. Prior to commencing operation in the morning or any other time the PV module 102 is initially exposed to sufficient illumination, the PV module 102 implements a safe-start algorithm facilitated by the power relays 216, other relays 218 and voltmeters 228B, 228C to qualify its load as either a battery or battery-less load and subsequently commences operation accordingly. Aspects of an example safe-start method are disclosed below with respect to FIGS. 10A-10B.

Power relay 216A is coupled between internal positive line 234 and external positive line 106. Similarly, power relay 216B is coupled between internal negative line 232 and external negative line 104. Furthermore, in the illustrated embodiment, the power relays 216 default to open when not powered. Accordingly, when the PV module 102 is turned off, e.g., not generating sufficient power to power the power relays 216, the power relays 216 are open and the PV module 102 is electrically isolated from the external lines 104, 106. In some embodiments, each of power relays 216 is a mechanical spring-loaded relay, a FET or IGBT with sufficient voltage rating to provide adequate isolation, or other suitable relay.

In some embodiments, both of relays 218 are highly isolated relays. Whereas the voltmeter 228C is connected in series to the relay 218, voltmeter 228C is a highly isolated sense line. As used herein, a relay is highly isolated if it is designed to transfer an electronic signal between elements of a circuit without permitting any current to be directly transferred across the relay. As such, each of relays 218 is a solid state optical relay or other suitable highly isolated relay according to some embodiments. Optical relays are also commonly known as optical isolators, optical coupling devices, optocouplers, and so on. Relays 218 are open during normal operation of the PV module 102.

Relay 218A is coupled between external positive line 106 and external negative line 104, while relay 218B is coupled in parallel with power relay 216A between internal positive line 234 and external positive line 106. When the PV module 102 is initializing prior to commencing normal operation and as part of the safe-start method described below, the relay 218A is closed to permit voltmeter 228C to measure the line potential across the external lines 104, 106.

If the measured line potential indicates the absence of any load on external lines 104, 106, the method aborts and the PV module 102 attempts to restart the next time it is sufficiently illuminated.

If the measured line potential is within a predetermined range indicating the presence of a battery (with or without an inverter) or the presence of an operating battery-less inverter connected to external lines 104, 106, the PV module 102 charges its internal capacitance to match the external voltage, power relays 216 are closed and the PV module 102 operates in maximum peak power mode until the battery is fully charged, whereupon the PV module 102 switches to constant voltage mode to keep the battery charged.

If the measured line potential is below the predetermined range indicating the absence of a battery and the circuit is continuous based on a measured RC response of the circuit indicating the presence of an inverter connected to external lines 104, 106, the PV module 102 closes relay 218B and trickles current on to the external positive line 106. The voltmeter 228C continues measuring the line potential across external lines 104, 106 and if the line potential increases, the relay 218B continues trickling current onto external positive output line 232A until the measured line potential matches the voltage of the PV module 102. When the line potential and voltage of the PV module 102 match, the power relays 216 are closed and the PV module 102 operates in constant voltage mode until the inverter begins operation, after which the PV module 102 changes to maximum peak power mode.

Voltmeters 228A and/or 228B are used by PV module 102 in the implementation of the MPPT method described below.

D. Terminals

In the illustrated embodiment of FIGS. 7A-7B, each of the terminals 130 extends in a direction substantially orthogonal to the major surface of the backsheet 144, as further seen in the example of FIG. 4. In some examples, each of the terminals 130 is a large-contact-area terminal. In these and other embodiments, each of the terminals 130 has a contact area of at least six square millimeters. Alternately or additionally, each of terminals 130 is configured to connect to a continuous section of wire having a diameter of at least 6 millimeters.

Figure 8:
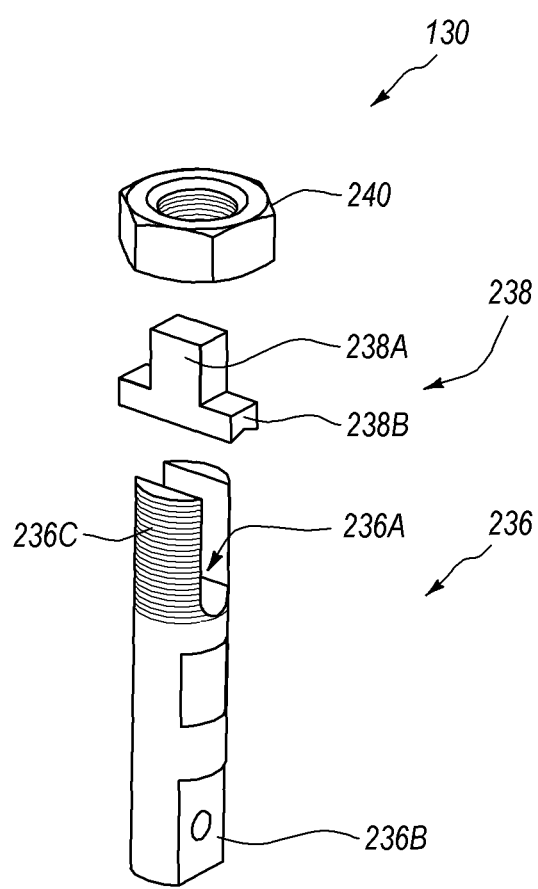
FIG. 8 is an exploded view of a terminal of the PV module of FIGS. 2A and 2B.

FIG. 8 is an exploded view of one of the terminals 130. As seen in FIGS. 7A-8, the terminal 130 includes a bolt 236, a washer 238, and a nut 240. In general, the bolt 236, washer 238 and nut 240 cooperate to engage a portion of a continuous wire within a u-shaped channel 236A of the bolt 236 as described below.

According to some embodiments, the bolt 236 has a diameter of at least 10 mm. The bolt 236 has a first end 236B (FIG. 8) configured to be electrically and mechanically connected to the electronics assembly 128 via fasteners 242 (FIG. 7B). The bolt 236 has a threaded second end 236C (FIG. 8). The second end 236C defines the u-shaped channel 236A (FIG. 8) configured to receive therein a continuous output line, e.g., a continuous wire. In this manner, a single continuous wire can be used to interconnect multiple PV modules 102 as in the configuration of FIG. 1. In some embodiments, by implementing a continuous wire to interconnect PV modules 102, connector-to-connector losses are reduced and/or substantially eliminated when compared to other configurations that interconnect PV modules 102 using discrete sections of wire between each PV module terminal.

The washer 238 is t-shaped and includes a stem 238A and top 238B. The thickness of the washer 238 is less than the width of the u-shaped channel 236A such that the washer 238 can be partially disposed within the u-shaped channel 236A. The width of the stem 238A is less than the inner diameter of the nut 240.

The configuration of the terminal 130 permits a portion of a continuous wire to be placed within the u-shaped channel 236A. The washer 238 is also placed within the u-shaped channel 236A with the top 238B of washer 238 facing towards the portion of the continuous wire disposed in the u-shaped channel 236A. Finally, the nut 240 is threaded onto the second end 236C of the bolt 236 over the stem 238A of washer 238. As the nut 240 is threaded onto the second end 236C of bolt 236, the nut 240 engages the top 238B of washer 238 and urges the top 238B of washer 238 against the portion of the continuous wire disposed in the u-shaped channel 236A.

Figure 9A:
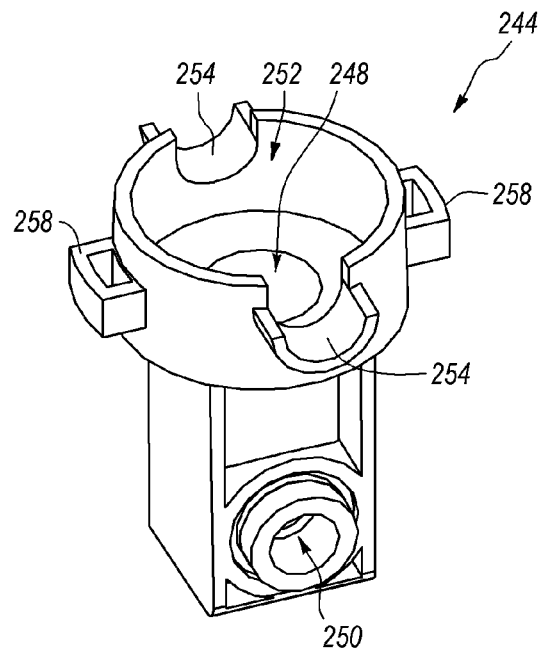
FIG. 9A is an isometric view of a terminal housing of the PV module of FIGS. 2A and 2B.
Figure 9B:
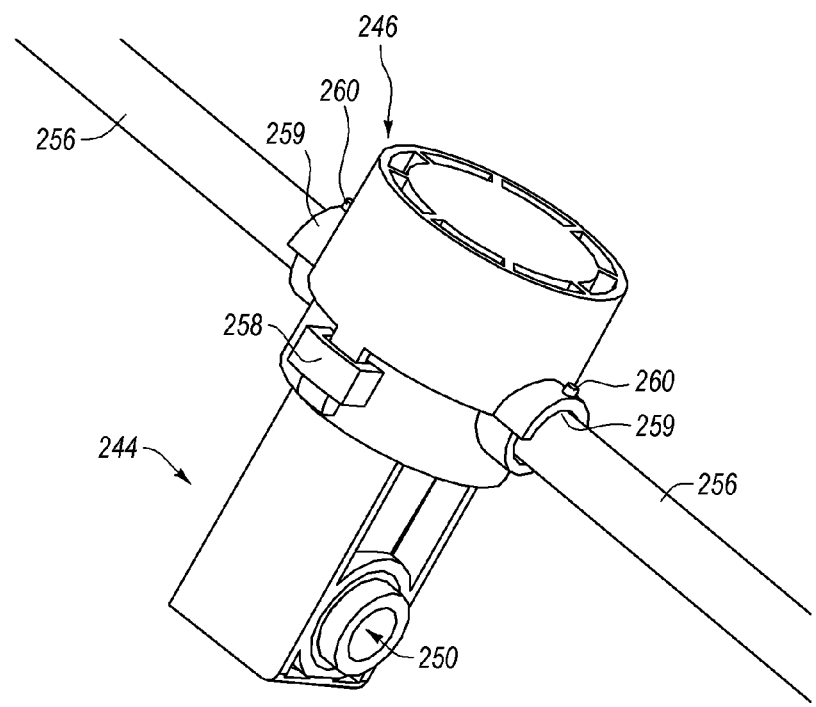
FIG. 9B is an isometric view of the terminal housing of FIG. 9A and a corresponding terminal cover.

FIGS. 9A and 9B illustrate a terminal housing 244 and terminal cover 246 (FIG. 9B) employed according to some embodiments to enclose a terminal 130 and thereby substantially prevent inadvertent contact with the terminal 130 and/or moisture penetration into the electronics assembly 128. A first cavity 248 (FIG. 9A) is formed in the terminal housing 244 and extends lengthwise at least partially through the terminal housing 244. The first cavity 248 is configured to receive the first end 236B of the bolt 236. A second cavity 250 is also formed in the terminal housing 244. The second cavity 250 extends orthogonal to the first cavity 248 at least partially through the terminal housing 244 and connects with the first cavity 248. The second cavity 250 is configured to receive a portion of the fastener 242 used to electrically and mechanically connect the bolt 236 to the electronics assembly 128.

Optionally, an o-ring gasket (not shown) is included around the opening of the second cavity 250 to seal the terminal housing 244 against the housing 188 (FIG. 4) of the electronics assembly 128.

The terminal housing 244 further includes a receptacle 252 (FIG. 9A). When assembled with the terminal 130, the second end 236A of the bolt 236 of terminal 130 extends into the receptacle 252. The receptacle 252 is also configured to accommodate the nut 240 when threaded onto the second end 236A of the bolt 236. Troughs 254 (FIG. 9A) are formed on opposing sides of the receptacle 252 and permit ingress and egress of a wire 256 (FIG. 9B) connected to a terminal 130 enclosed by the terminal housing 244 and terminal cover 246.

Optionally, clips 258 are included on outer opposing sides of the receptacle 252. In some embodiments, the terminal cover 246 includes protrusions (not shown) that engage clips 258 to secure the terminal cover 246 to the terminal receptacle 244. In this and other examples, the terminal cover 246 is snapped into place on the terminal housing 244.

The terminal cover 246 cooperates with the terminal housing 244 to enclose the terminal 130. In this regard and in the present example, the terminal cover 246 includes troughs 259 that align with the troughs 254 of the terminal housing 244 to permit ingress and egress of the wire 256.

As already indicated above, the terminal cover 246 may include protrusions (not shown) that engage the clips 258 of terminal housing 244. In the event the protrusions or clips 258 break or otherwise fail, the terminal cover 246 optionally includes other features for attaching the terminal cover 246. For instance, in the illustrated example of FIG. 9B, nubs 260 are included on the outside of each of the troughs 259 of terminal cover 246. In this and other examples, a cable tie or other suitable fastener is wrapped around the wire 256 and engages the nubs 260 to secure the terminal cover 246 to the wire 256. Because the wire 256 is connected to the terminal 130 within the terminal housing 244, this effectively secures the terminal cover 246 to the terminal housing 244.

III. Example Methods

With additional reference to FIGS. 10A-12, various methods are disclosed that can be implemented by PV module 102. One skilled in the art will appreciate that, for these and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

A. Battery or Battery-Less Safe-Start

Figure 10A:
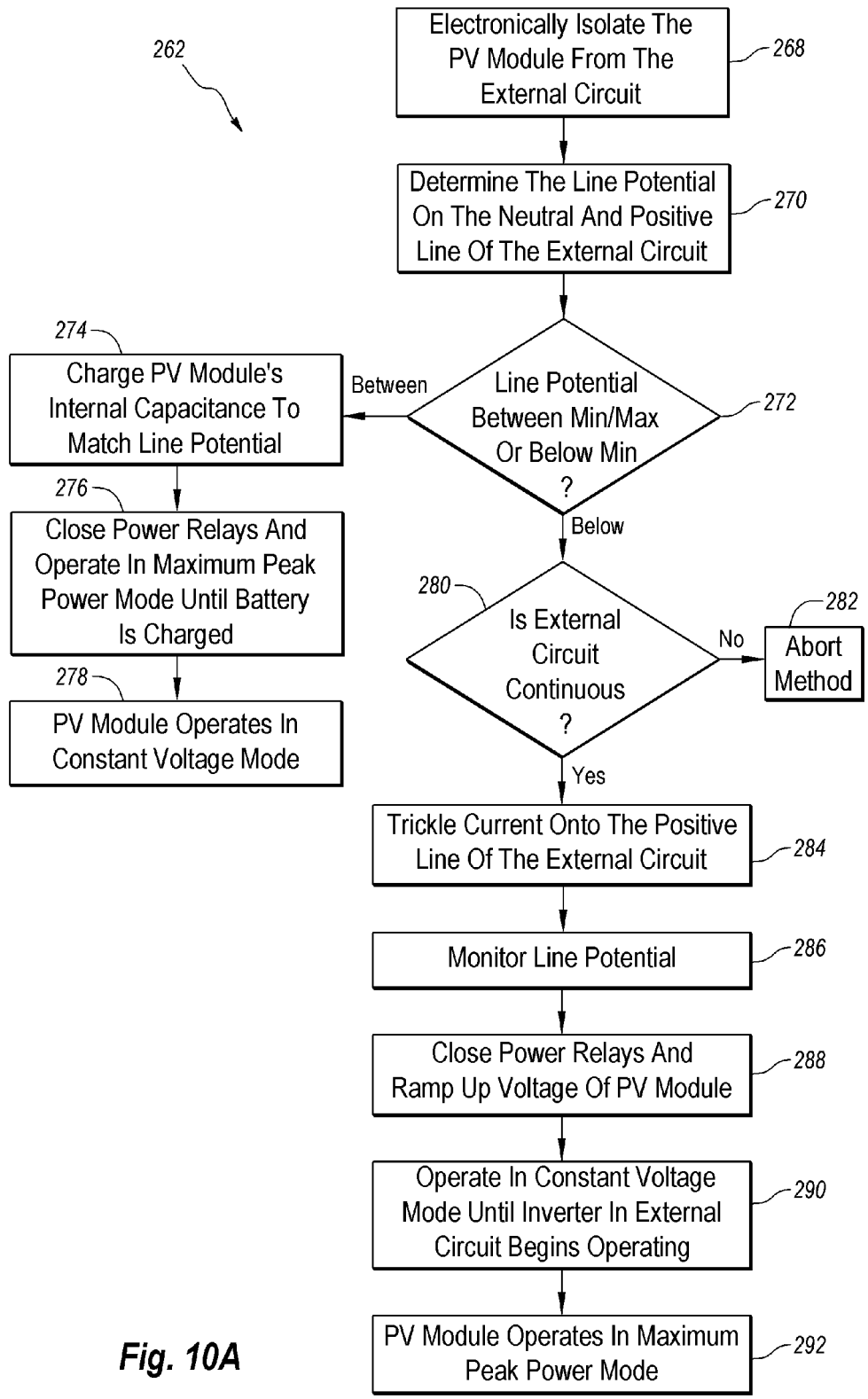
FIG. 10A is a flow chart illustrating an example method of commencing operation in the PV module of FIGS. 2A and 2B.
Figure 10B:
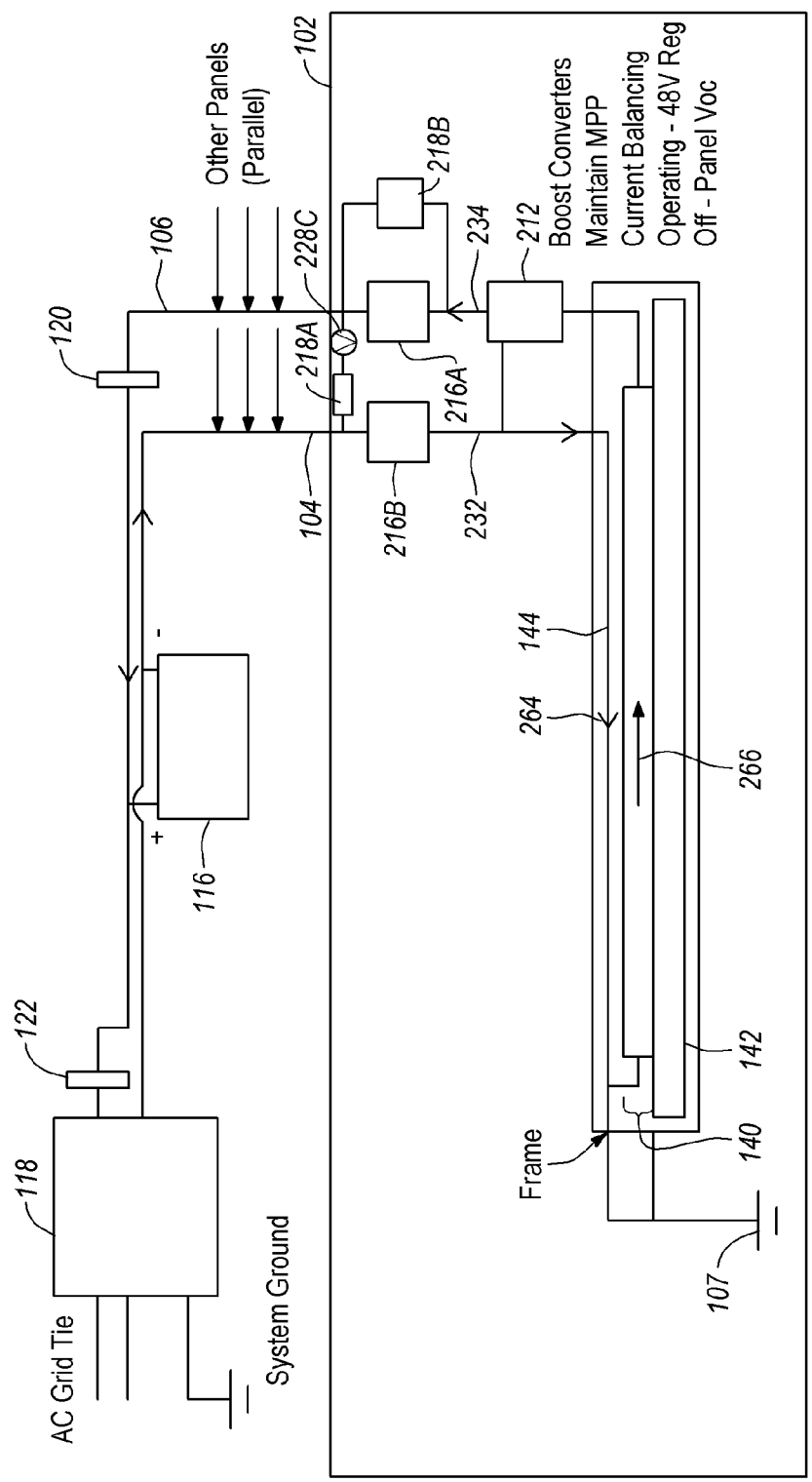
FIG. 10B is a high-level circuit diagram depicting electrical connections between the PV module of FIGS. 2A-2B and the example operating environment of FIG. 1.

Referring first to FIGS. 10A and 10B, an example safe-start method 262 (FIG. 10A) that can be implemented by PV module 102 is disclosed according to some embodiments. In particular, FIG. 10A is a flow chart illustrating the example safe-start method 262. FIG. 10B is similar to FIG. 1 in some respects and is a circuit diagram showing the electrical connections between one of the PV modules 102 and the example operating environment 100. All of the components of FIG. 10B have previously been discussed with respect to, e.g., FIGS. 1 and 7C. FIG. 10B is provided to, among other things, illustrate how the components of FIGS. 1 and 7C relate to each other and to provide a context for the discussion of the method 262 of FIG. 10A. Additionally, FIG. 10B includes arrows 264, 266 indicating the direction of current flow through the backsheet 144 and cell layer 140 of PV module 102 according to some embodiments.

Accordingly, with combined reference to FIGS. 10A-10B, an example method 262 is disclosed for safely starting or otherwise commencing operation in a dual-use PV module 102. The method 262 begins at 268 by electrically isolating the PV cells 124 (not labeled in FIG. 10B) of cell layer 140 and the electronics 198 (not labeled in FIG. 10B) including power conversion circuits 212 from the external circuit including external lines 104, 106 and optionally battery 116 and/or inverter 118 when the PV module 102 is not operating. In some embodiments, electrically isolating 268 the PV cells 124 and/or electronics 198 from the external circuit includes opening power relays 216.

At 270, the line potential across external lines 104, 106 is determined to qualify the load, if any, of the external circuit. Determining 270 the line potential across external lines 104, 106 in some embodiments includes closing the relay 218A and measuring the line potential using voltmeter 228C. Moreover, determining 270 the line potential across external lines 104, 106 generally occurs in the morning or other time of day after the PV module receives sufficient illumination to generate sufficient power to at least close the relay 218A and operate voltmeter 228C. Alternately or additionally, the generated power is sufficient to operate control module 214 (FIG. 7C) and/or other electronics 198 that control/facilitate operation of the PV module 102 during execution of the method 262 of FIG. 10A.

At 272, the measured line potential is compared to one or more predetermined system voltage limits, including a minimum system voltage limit and a maximum system voltage limit. Optionally, the minimum and maximum system voltage limits are defined in firmware stored in storage medium 220 (FIG. 7C). The minimum and maximum system voltage limits define an acceptable voltage range indicating one or more batteries connected to external lines 104, 106.

Although not shown in FIG. 10A, if the measured line potential is above the maximum system voltage limit, the method 262 repeats steps 268, 270 and 272 until the measured line potential is within an acceptable range.

If the measured line potential is between the minimum and maximum system voltage limits, indicating that one or more batteries 116 (or an operating battery-less inverter) are connected to the external lines 104, 106, the method 262 continues at 274 by charging the internal capacitance of the PV module 102 to match the measured line potential. Charging 274 the internal capacitance of the PV module 102 generally includes, among other things, using the PV cells 124 (not labeled in FIG. 10A) and power conversion circuits 212 to raise the voltage by increasing the voltage of the capacitors within PV module 102.

After the internal capacitance of the PV module 102 has been charged to meet the measured line potential, at 276 the power relays 216 are closed and the PV module 102 outputs power to the external circuit. In some embodiments, outputting power to the external circuit includes operating in maximum peak power mode until the battery 116 is charged, and then switching at 278 to operate in constant voltage mode to keep the battery 116 charged.

Alternately or additionally, the PV module 102 is configured to adjust the voltage of its output power in constant voltage mode to match the rated voltage of the one or more batteries 116 of the external circuit. For instance, if the one or more batteries 116 of the external circuit are rated for 12 volts, 24 volts, or 48 volts, the PV module 102 in some embodiments adjusts the voltage of its output power to about 12 volts, 24 volts, or 48 volts, respectively.

Returning to the decision at 272, if the measured line potential is below the minimum system voltage limit, indicating the absence of any batteries from the external circuit, the method 262 continues at 280 by determining whether the external circuit is continuous and has the capability to maintain a charge, e.g., whether the external circuit is capacitive. Determining 280 whether the external circuit is continuous and has the capability to maintain a charge may include trickling a small amount of current onto external positive line 106 using, e.g., relay 218B and/or measuring the resistor-capacitor ("RC") response of the external circuit including external lines 104, 106 using voltmeter 228C. Further, in some embodiments, the measured RC response indicates the presence of an inverter without a battery in the external circuit.

If it is determined at 280 that the external circuit is not continuous, the method 262 aborts at 282.

If it is determined at 280 that the external circuit is continuous and has the capability to maintain a charge based on, e.g., the RC response of the external circuit, the method 262 continues at 284 by continuously trickling a small amount of current onto external positive line 106 using, e.g., relay 218B.

At 286, the line potential on external lines 104, 106 is monitored while continuously trickling 284 the current onto the external positive line 106 to identify when the line potential reaches the voltage of the PV module 102.

After the line potential matches the voltage of the PV module 102, at 288 the power relays 216 are closed and the PV module 102 outputs power to the external circuit. In some embodiments, outputting power to the external circuit includes ramping up the voltage of the PV module 102 to a prescribed operating voltage, such as 57 volts, operating 290 in constant voltage mode at the prescribed operating voltage until the inverter in the external circuit begins operating, and switching 292 to operation in maximum peak power mode after the inverter begins operating. In some embodiments, the prescribed operating voltage and/or the line potential on external lines 104, 106 during operation in maximum peak power mode is between the minimum and maximum system voltage limits. Additionally, the relay 218B is opened and current trickling 284 discontinues when the power relays 216 are closed at 288.

With combined reference to FIGS. 1 and 10A-10B, the method 262 is generally executed by the first PV module 102 to "wake up" in the morning or other time of day after receiving sufficient illumination. The first PV module 102 to wake up may or may not be the same from one day to the next and may depend on, for instance, illumination and/or shading conditions in the example operating environment 100 and daily/seasonal variations thereof, the amount of power required to operate the respective control module 214, relay 218A and/or voltmeter 228C of each PV module 102, and/or other factors.

In some cases, two or more PV modules 102 within the example operating environment 100 may wake up at about the same time. In these cases, the multiple PV modules 102 may execute the method 262 substantially simultaneously. Thus, if the multiple PV modules 102 determine 272 at about the same times that the line potential is between the maximum and minimum voltages (indicating the presence of battery 116 in the external circuit), the multiple PV modules 102 may simultaneously, or at about the same times, charge 274 their respective internal capacitances and perform the other steps 276, 278 of the method 262. Alternately, if the multiple PV modules 102 determine 272 at about the same times that the line potential is below the minimum voltage followed by determining 280 at about the same times that the external circuit is continuous, the multiple PV modules 102 may simultaneously, or at about the same times, trickle 284 current onto the external positive line 106 of the external circuit and perform the other steps 286, 288, 290 and 292 of the method 262.

After the first PV module 102 has executed the method 262 and commenced operation, the first PV module 102 will look like a battery to other PV modules 102 within the example operating environment 100 that subsequently wake up. Thus, according to some embodiments, the other PV modules 102 that subsequently wake up may generally perform at least steps 268, 270, 272, 274 and 276 to commence operation, whether or not an actual battery 116 is present in the external circuit.

Alternately or additionally, after the inverter is up and running, whether in an external circuit including or excluding a battery, the voltage target for each of the PV modules 102 is set above the voltage target for the inverter to ensure operation in MPPT mode is maintained.

B. Maximum Peak Power Tracking

Figure 11A:
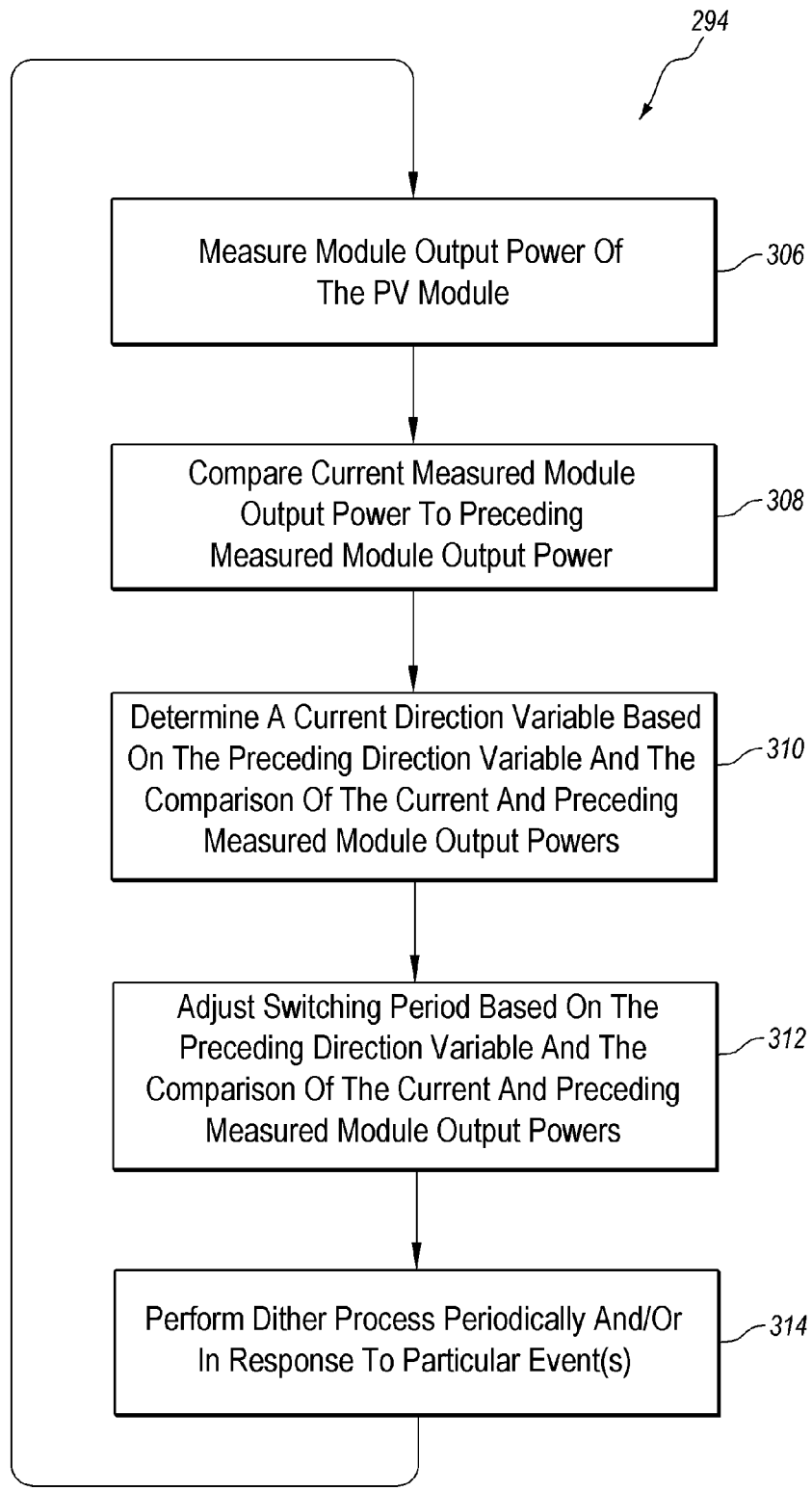
FIG. 11A is a flow chart illustrating an example method of performing maximum peak power tracking in the PV module of FIGS. 2A-2B.
Figure 11B:
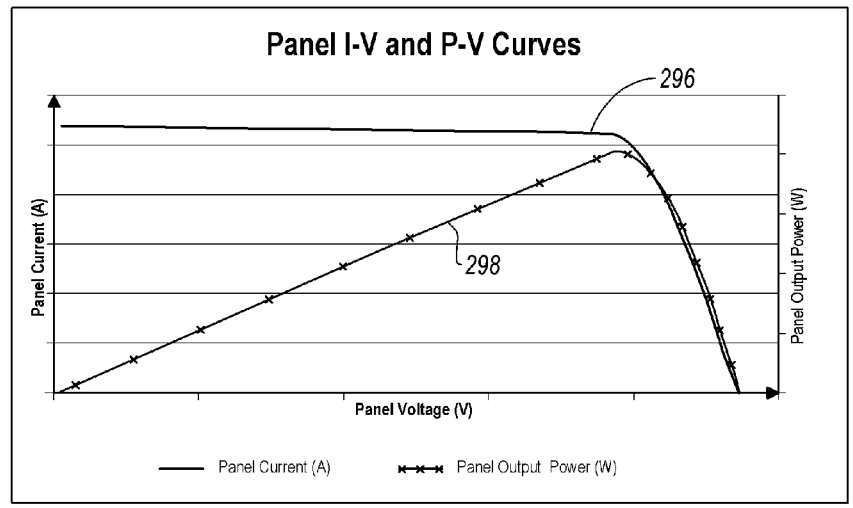
FIG. 11B is a graph including characteristic IV and PV curves for the collective output of the PV cells of the PV module of FIGS. 2A-2B.
Figure 11C:
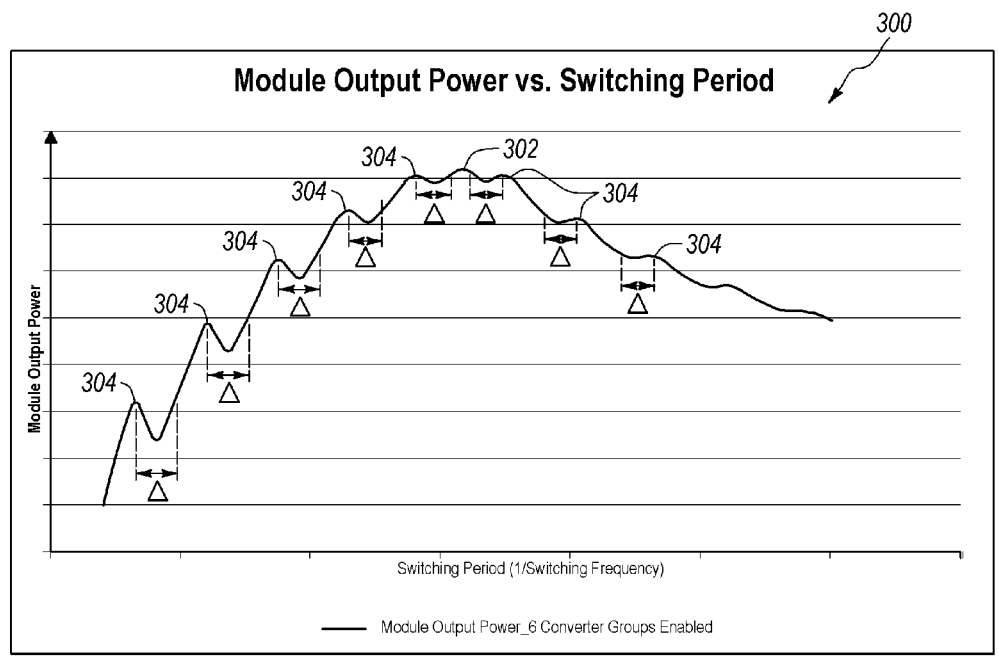
FIG. 11C is a graph including a power curve as a function of switching period for the output of the PV module of FIGS. 2A-2B.

Referring next to FIGS. 11A-11C, an example MPPT method 294 (FIG. 11A) that can be implemented by PV module 102 is disclosed according to some embodiments. In more detail, FIG. 11A is a flow chart illustrating the example MPPT method 294, FIG. 11B graphically illustrates the current curve 296 and power curve 298 corresponding to the current and power collectively generated by the PV cells 124 of PV module 102 as a function of panel voltage (e.g., the voltage at the input of the electronics assembly 128 collectively generated by PV cells 124), and FIG. 11C graphically illustrates the power curve 300 corresponding to power collectively generated by power conversion circuits 212 and output by PV module 102 as a function of switching period of the power conversion circuits 212. The switching period is the inverse of the switching frequency of power conversion circuits 212.

The current curve 296, power curve 298 and power curve 300 of FIGS. 11B and 11C will be respectively referred to hereinafter as "panel current curve 296," "panel output power curve 298," and "module output power curve 300." The current, power and power corresponding to the panel current curve 296, panel output power curve 298, and module output power curve 300 will be respectively referred to hereinafter as panel current, panel output power, and module output power.

According to some embodiments, six pairs of power conversion circuits 212 are employed by each PV module 102. As already mentioned above, the two power conversion circuits 212 of each pair may be operated 180 degrees out of phase with each other. Generally, the power conversion circuits 212 operate in discontinuous mode with a fixed duty cycle according to some embodiments. Optionally, the fixed duty cycle is about 50%. An inductance value of each power conversion circuit 212 is fixed and is determined by the inductor included within each power conversion circuit 212. With a fixed duty cycle and a fixed inductance value, the current in each inductor is directly proportional to panel voltage and the switching frequency of the power conversion circuits 212.

Accordingly, and in some embodiments, the module output power is maximized by operating the PV module 102 at the maximum panel output power. The maximum panel output power can readily be determined from the panel output power curve 298 of FIG. 11B. Moreover, the panel output power is tracked in some embodiments by sensing the module output power associated with the module output power curve 300 of FIG. 11C. The process of tracking and maximizing the module output power is embodied by the MPPT method 294 of FIG. 11A.

Generally, the method 294 of FIG. 11A implements a hill climbing approach with a dither process. The hill climbing approach of the method 294 generally involves determining whether the PV module 102 is operating to the right or left of a global peak 302 of the module output power curve 300 and then making a relatively minor adjustment to the switching period of the power conversion circuits 212 to move the module output power towards the global maximum 302. The actual module output power is then measured and the hill climbing approach repeats.

Because the module output power curve 300 includes numerous ripples or local maxima 304 as seen in FIG. 11C, the method 294 additionally implements the dither process. The dither process of the method 294 generally involves periodically "jumping" to the right (or left) on the module output power curve 300 by making a more significant adjustment to the switching period of the power conversion circuits 212 and then measuring the module output power to ensure the PV module 102 is not stuck operating on one of the local maxima 304. If the measured module output power is greater than the previously measured module output power, the dither process continues jumping to the right (or left) until a lower module output power is encountered, and then returns to the switching period corresponding to the highest measured module output power. If after the first jump the measured module output power is less than the previously measured module output power, the dither process returns to the switching period corresponding to the previously measured module output power, and then jumps to the left (or right) to ensure the global peak 302 is not located to the left (or right) of where the PV module 102 has been operating. The dither process may be invoked at predetermined intervals and/or in response to one or more particular events.

In more detail, and with respect to FIG. 11A, the method 294 is performed in some embodiments by the electronics assembly 128. In the illustrated embodiment, the method 294 begins at 306 by measuring the module output power of the PV module 102. Optionally, measuring the module output power of the PV module 102 is accomplished using the voltmeter 228B and one or more both of ammeters 230A, 230B of FIG. 7C.

At 308, the method 294 continues by comparing a current measured module output power to a preceding measured module output power. In some embodiments, comparing 308 the current measured module output power to the preceding measured module output power is performed by the control module 214 of FIG. 7C.

At 310, a current direction variable indicating a side of the global peak 302 on which the PV module 102 is currently operating is determined based on (1) a preceding direction variable indicating a side of the global peak 302 on which the PV module 102 was previously operating, and (2) the comparison at 308 of the current measured output power to the preceding measured output power. Alternately or additionally, a direction variable greater than zero, e.g., a positive direction variable, indicates the right side of the global peak 302, and a direction variable less than zero, e.g., a negative direction variable, indicates the left side of the global peak 302.

At 312, the charge time of the inductor within each power conversion circuit 212, corresponding to the switching period of the power conversion circuits 212, is adjusted based on (1) the preceding direction variable, and (2) the comparison at 308 of the current measured output power to the preceding measured output power.

In some embodiments, steps 310 and 312 include:
maintaining the preceding direction variable as the current direction variable and increasing the switching period if the preceding direction variable is greater than zero and the current measured module output power is greater than the preceding measured module output power;
setting the current direction variable to a negative number and decreasing the switching period if the preceding direction variable is greater than zero and the current measured output power is less than the preceding measured output power;
maintaining the preceding direction variable as the current direction variable and decreasing the switching period if the preceding direction variable is less than zero and the current measured module output power is greater than the preceding measured module output power; or
setting the current direction variable to a positive number and increasing the switching period if the preceding direction variable is less than zero and the current measured output power is less than the preceding measured module output power.

Optionally, the method 294 of FIG. 11A further includes allowing the capacitors within power conversion circuits 212 to change charge in response to the adjustment to the switching period and iterating the method 294 during operation of the PV module 102.

Alternately or additionally, and as illustrated in FIG. 11A, the method 294 further includes performing a dither process at 314 to ensure the PV module 102 is not stuck operating on one of the local maxima 304 of the module output power curve 300. In this regard, it is apparent from FIG. 11C that the difference in switching period from each local maxima 304 to the corresponding next switching period that produces equivalent output power is practically constant. This practically constant difference is identified in FIG. 11C with the Greek letter $\Delta$.

It is understood that FIG. 11C graphically illustrates the module output power curve 300 corresponding to a particular module output power. The module output power curve 300 is representative of module output power curves corresponding to different module output power curves. Thus, although module output power curves at different module output powers may generally be similar to the module output power curve 300 of FIG. 11C, such module output power curves may also include some differences from module output power 300. For example, the magnitude of the difference A at one module output power may be different than the magnitude of the difference A at another module output power. Generally, however, the dither process in some embodiments involves jumping the switching period to the right (or left) by an amount greater than A (at any given module output power) to ensure that the corresponding local minima are cleared.

As previously mentioned above, the dither process 314 is invoked on a periodic basis. Alternately or additionally, the dither process 314 is performed in response to one or more events. For instance, the dither process 314 may be invoked in response to changes in illumination conditions of the PV module 102 and/or changes in the number of paired power switching circuits 212 in operation at any given time. With respect to changes in illumination conditions, such changes may be detected by detecting significant changes (e.g., changes greater than a predetermined threshold) in panel voltage or module output power.

With respect to the number of paired switching circuits 212 in operation, the control module 214 may track the number of paired switching circuits 212 in operation, which number may be periodically changed to optimize module output power based on the panel voltage and panel output power. Because of the existence of ripples in module output power curves, such as the module output power curve 300 of FIG. 11C, the ratio of optimum switching periods corresponding to different numbers of operating paired power conversion circuits 212 is nonlinear. Accordingly, changing the number of operating paired power conversion circuits 212 triggers the dither process 314 in some embodiments.

Figure 12:
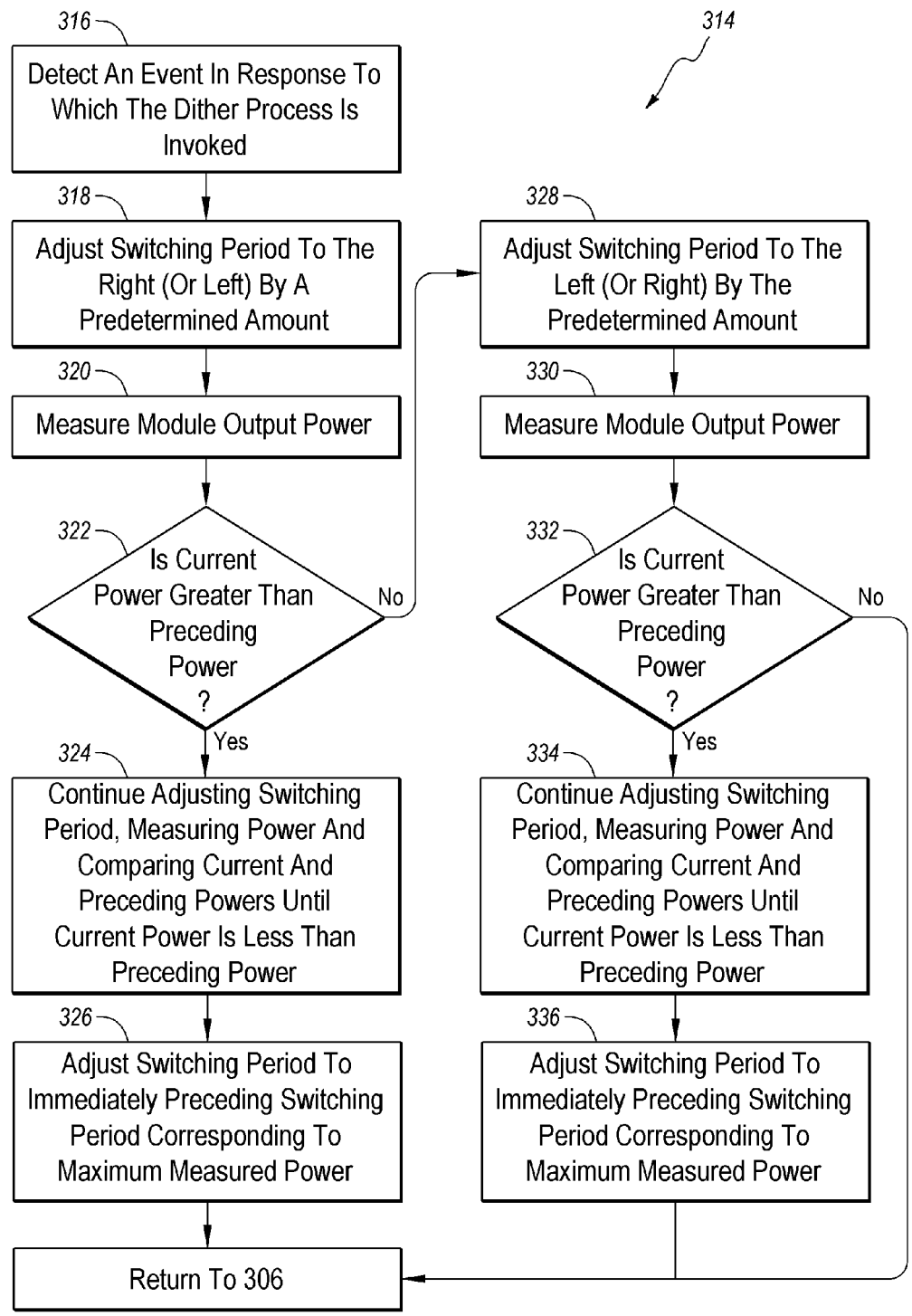
FIG. 12 is a flow chart illustrating an example dither process that may be invoked by the method of FIG. 11A.

With additional reference to FIG. 12, aspects of an example dither process 314 are disclosed. In the illustrated embodiment of FIG. 12, the dither process 314 optionally begins at 316 by detecting an event in response to which the dither process 314 is invoked. The event may be a change in illumination conditions, a change in the number of operating paired switching circuits 212, or the like.

The dither process 314 proceeds to 318 by adjusting the switching period to the right of the preceding switching period by a predetermined amount greater than A to a current switching period. Alternately or additionally, the dither process 314 periodically begins at step 318 without first detecting an event.

At 320, the module output power corresponding to the current switching period is measured.

At 322, the current measured module output power is compared to a preceding measured module output power corresponding to the preceding switching period.

If the current measured module output power is greater than the preceding measured module output power at 322, the dither process 314 proceeds at 324 to repeatedly adjust the switching period to the right by the predetermined amount A until the current measured module output power is less than the immediately preceding measured module output power.

After determining at 324 that the current measured module output power is less than the immediately preceding measured module output power, at 326 the dither process 314 adjusts the switching period to the immediately preceding switching period corresponding to the immediately preceding measured module output power (e.g., the maximum measured module output power) and returns to step 306 of the method 294 of FIG. 11A.

Alternately, if it is determined at 322 that the current measured module output power is less than the preceding measured module output power, the dither process 314 proceeds to 328 where the switching period is adjusted to the left of the preceding switching period by the predetermined amount greater than A to a current switching period.

At 330, the module output power corresponding to the current switching period is measured.

At 332, the current measured module output power is compared to the preceding measured module output power corresponding to the preceding switching period.

If the current measured module output power is greater than the preceding measured module output power at 332, the dither process 314 proceeds at 334 to repeatedly adjust the switching period to the left by the predetermined amount A until the current measured module output power is less than the immediately preceding measured module output power.

After determining at 334 that the current measured module output power is less than the immediately preceding measured module output power, at 336 the dither process 314 adjusts the switching period to the immediately preceding switching period corresponding to the immediately preceding measured module output power (e.g., the maximum measured module output power) and returns to step 306 of the method 294 of FIG. 11A.

Alternately, if it is determined at 332 that the current measured module output power is less than the preceding measured module output power, the dither process 314 adjusts the switching period back to the switching period corresponding to the preceding measured module output power and returns to step 306 of the method 294 of FIG. 11A.

The embodiments described herein may include the use of a special purpose or general-purpose computer including various computer hardware or software modules, as discussed in greater detail below.

Embodiments within the scope of the present invention also include computer-readable media for carrying or having computer-executable instructions or data structures stored thereon. Such computer-readable media can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium which can be used to carry or store desired program code means in the form of computer-executable instructions or data structures and which can be accessed by a general purpose or special purpose computer. When information is transferred or provided over a network or another communications connection (either hardwired, wireless, or a combination of hardwired or wireless) to a computer, the computer properly views the connection as a computer-readable medium. Thus, any such connection is properly termed a computer-readable medium. Combinations of the above should also be included within the scope of computer-readable media.

Computer-executable instructions comprise, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used herein, the term "module" or "component" can refer to software objects or routines that execute on the computing system. The different components, modules, engines, and services described herein may be implemented as objects or processes that execute on the computing system (e.g., as separate threads). While the system and methods described herein are preferably implemented in software, implementations in hardware or a combination of software and hardware are also possible and contemplated. In this description, a "computing entity" may be any computing system as previously defined herein, or any module or combination of modulates running on a computing system.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method to operate a photovoltaic module, the method comprising:
   electrically isolating a plurality of photovoltaic cells and a plurality of power conversion circuits of a photovoltaic module from an external circuit including an external negative line and an external positive line respectively connected to an internal negative line and internal positive line of the photovoltaic module;
   determining a line potential across the external negative and positive lines;
   determining whether the external circuit includes a battery based on the determined line potential; and
      if it is determined that the external circuit includes a battery, initializing operation of the photovoltaic module consistent with the external circuit including a battery; or
      if it is determined that the external circuit lacks a battery:
         determining that the external circuit includes an inverter; and
         initializing operation of the photovoltaic module consistent with the external circuit including an inverter.

2. The method of claim 1, wherein the external circuit includes a battery and an inverter or the external circuit lacks a battery and includes an inverter.

3. The method of claim 2, further comprising setting a target voltage of the photovoltaic module above a target voltage of the inverter.

4. The method of claim 1, wherein determining that the external circuit includes an inverter includes measuring a resistor-capacitor ("RC") response of the external circuit.

5. The method of claim 1, wherein:
determining whether the external circuit includes the battery based on the determined line potential includes comparing the determined line potential to a minimum and maximum voltage;
it is determined that the external circuit includes the battery when the determined line potential is between the minimum and maximum voltage; and
it is determined that the external circuit lacks the battery when the determined line potential is below the minimum voltage.

6. The method of claim 1, wherein initializing operation of the photovoltaic module consistent with the external circuit including the inverter includes:
continuously trickling current onto the external positive line via an optical relay coupled between the internal and external positive lines;
monitoring the line potential across the external negative and positive lines while the current is continuously trickled onto the external positive line; and
after the monitored line potential matches an internal voltage of the photovoltaic module, closing two power relays respectively coupled between the internal and external negative lines and between the internal and external positive lines;
wherein the method further includes:
discontinuing the trickle of current by opening the optical relay; and
outputting power to the external circuit via the external negative and positive lines.

7. The method of claim 6, wherein outputting power to the external circuit includes:
ramping up voltage of the photovoltaic module to a prescribed operating voltage; and
outputting power to the external circuit according to a constant voltage mode at the prescribed operating voltage until the inverter begins operating.

8. The method of claim 7, wherein outputting power to the external circuit further includes outputting power to the external circuit according to a maximum peak power mode after the inverter begins operating.

9. The method of claim 1, wherein initializing operation of the photovoltaic module consistent with the external circuit including the battery includes:
charging an internal capacitance of the photovoltaic module to match the determined line potential; and
closing two power relays respectively coupled between the internal and external negative lines and between the internal and external positive lines;
wherein the method further includes outputting power to the external circuit via the external negative and positive lines.

10. The method of claim 9, wherein outputting power to the external circuit includes outputting power to the external circuit according to a maximum peak power mode until the battery is charged.

11. The method of claim 10, wherein outputting power to the external circuit according to a maximum peak power mode includes:
measuring module output power collectively generated by the plurality of power conversion circuits of the photovoltaic module, wherein output power collectively generated by the plurality of power conversion circuits is characterized by a module power output curve having a peak;
comparing a current measured output power to a preceding measured output power; and
based on a preceding direction variable indicating a side of the peak on which the photovoltaic module was previously operating and the comparison of the current measured output power to the preceding measured output power:
determining a current direction variable indicating a side of the peak on which the photovoltaic module is currently operating; and
adjusting a switching period of the plurality of power conversion circuits.

12. The method of claim 11, further comprising operating the plurality of power conversion circuits in pairs, each power conversion circuit in a pair being operated 180 degrees out of phase with the other power conversion circuit in the pair.

13. The method of claim 11, further comprising, in response to detecting the failure of at least one of the power conversion circuits, applying full current of the photovoltaic module through the failed power conversion circuit to cause a corresponding fuse to fail.

14. The method of claim 11, wherein determining the current direction variable and adjusting the switching period based on the preceding direction variable and the comparison of the current measured output power to the preceding measured output comprises:
if the preceding direction variable is greater than zero and the current measured output power is greater than the preceding measured output power, maintaining the preceding direction variable as the current direction variable and increasing the switching period;
if the preceding direction variable is greater than zero and the current measured output power is less than the preceding measured output power, setting the current direction variable to a negative number and decreasing the switching period;
if the preceding direction variable is less than zero and the current measured output power is greater than the preceding measured output power, maintaining the preceding direction variable as the current direction variable and decreasing the switching period; or
if the preceding direction variable is less than zero and the current measured output power is less than the preceding measured output power, setting the current direction variable to a positive number and increasing the switching period.

15. The method of claim 14, wherein each power conversion circuit includes at least one capacitor, the method further comprising:
allowing the at least one capacitor to change charge in response to the adjustment to the switching period, wherein the current measured output power becomes a new preceding measured output power and the current direction variable becomes a new preceding direction variable after allowing the at least one capacitor to change charge;

measuring the module output power collectively generated by the plurality of power conversion circuits after allowing the at least one capacitor to change charge to obtain a new current measured output power;

comparing the new current measured output power to the new preceding measured output power; and determining a new direction variable and adjusting the switching period based on the new preceding direction variable and the comparison of the new current measured output power to the new preceding measured output power.

16. The method of claim 10, wherein outputting power to the external circuit further includes outputting power to the external circuit according to a constant voltage mode after the battery is charged to keep the battery charged.

* * * * *